US010720205B2

(12) United States Patent
Huang et al.

(10) Patent No.: US 10,720,205 B2
(45) Date of Patent: Jul. 21, 2020

(54) SYSTEMS AND METHODS INVOLVING MULTI-BANK, DUAL-PIPE MEMORY CIRCUITRY

(71) Applicant: GSI TECHNOLOGY, INC., Sunnyvale, CA (US)

(72) Inventors: Mu-Hsiang Huang, San Jose, CA (US); Robert Haig, Austin, TX (US); Patrick Chuang, Cupertino, CA (US); Lee-Lean Shu, Los Altos, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 14/732,639

(22) Filed: Jun. 5, 2015

(65) Prior Publication Data

US 2015/0357028 A1 Dec. 10, 2015

Related U.S. Application Data

(60) Provisional application No. 62/008,447, filed on Jun. 5, 2014, provisional application No. 62/008,449, filed on Jun. 5, 2014.

(51) Int. Cl.
*G11C 11/419* (2006.01)
*G11C 8/12* (2006.01)
(Continued)

(52) U.S. Cl.
CPC .............. *G11C 11/419* (2013.01); *G11C 8/12* (2013.01); *G11C 11/418* (2013.01); *G11C 7/1087* (2013.01)

(58) Field of Classification Search
CPC ..... G11C 11/419; G11C 11/418; G11C 7/1087
(Continued)

(56) References Cited

U.S. PATENT DOCUMENTS 6,072,741 A * 6/2000 Taylor ................. G06F 5/10
365/219
6,567,338 B1 * 5/2003 Mick ................. G11C 7/1039
365/189.07

(Continued)

OTHER PUBLICATIONS

International Search Report and Written Opinion from PCT/US2015/034581 dated Sep. 15, 2015, 22 pages.
(Continued)

*Primary Examiner* — Mushfique Siddique
(74) *Attorney, Agent, or Firm* — DLA Piper LLP (US)

(57) ABSTRACT

Multi-bank, dual-pipe SRAM systems, methods, processes of operating such SRAMs, and/or methods of fabricating multi-bank, dual-pipe SRAM are disclosed. For example, one illustrative multi-bank, dual-pipe SRAM may comprise features for capturing read and write addresses, splitting and/or combining them via one or more splitting/combining processes, and/or bussing them to the SRAM memory banks, where they may be read and written to a particular bank. Illustrative multi-bank, dual-pipe SRAMs and methods herein may also comprise features for capturing two beats of write data, splitting and/or combining them via one or more splitting/combining processes, and bussing them to each SRAM bank, where they may be split/combined/recombined via one or more processes to write data to particular memory bank(s).

30 Claims, 26 Drawing Sheets

AIPu and AIPv Block Diagram – Version #1, Without Write Buffering

(51) Int. Cl.
    *G11C 11/418* (2006.01)
    *G11C 7/10* (2006.01)
(58) Field of Classification Search
    USPC .......................................................... 365/154
    See application file for complete search history.

(56) References Cited

U.S. PATENT DOCUMENTS

| | | | |
|---|---|---|---|
| 7,565,480 | B2 | 7/2009 | Ware et al. |
| 9,613,684 | B2 * | 4/2017 | Shu ........................ G11C 11/418 |
| 2009/0231943 | A1 * | 9/2009 | Kunce ....................... G11C 8/12 |
| | | | 365/230.03 |
| 2011/0280307 | A1 | 11/2011 | MacInnis et al. |
| 2013/0039131 | A1 * | 2/2013 | Haig ................... G11C 7/1039 |
| | | | 365/189.02 |

OTHER PUBLICATIONS

TW Office Action in Application No. 104118340 dated Feb. 21, 2019.
Partial Translation of TW Office Action in Application No. 104118340 dated Feb. 21, 2019.
Search Report in TW Application No. 104118340 dated Feb. 21, 2019.
Chinese Office Action issued in Application No. 201580035542.5 dated Sep. 30, 2019.

* cited by examiner

Figure 1: Control. Address, and Data Input in a Quad-B2 SRAM

PRIOR ART

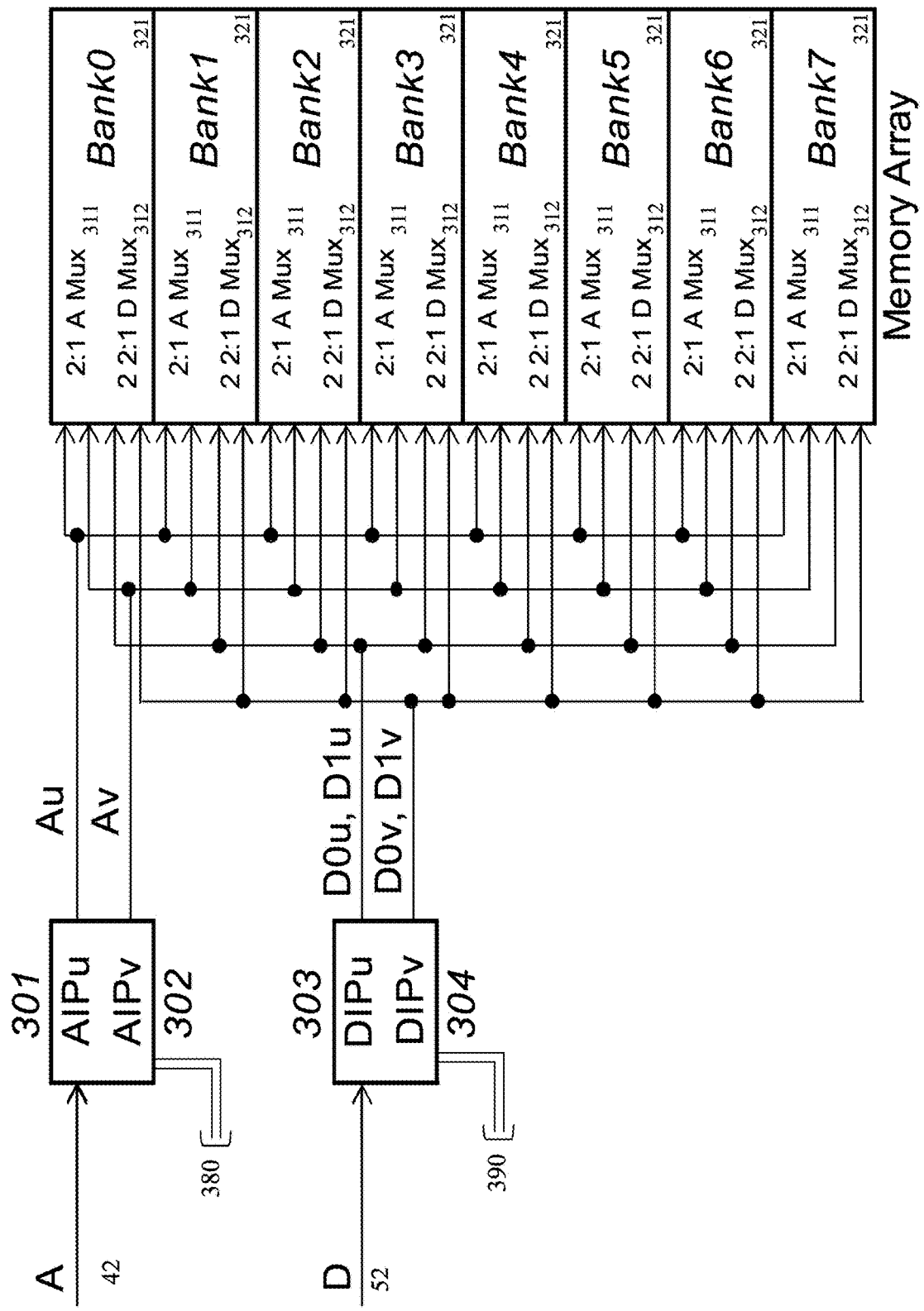
Figure 3: Multi-Bank Dual-Pipe Block Diagram

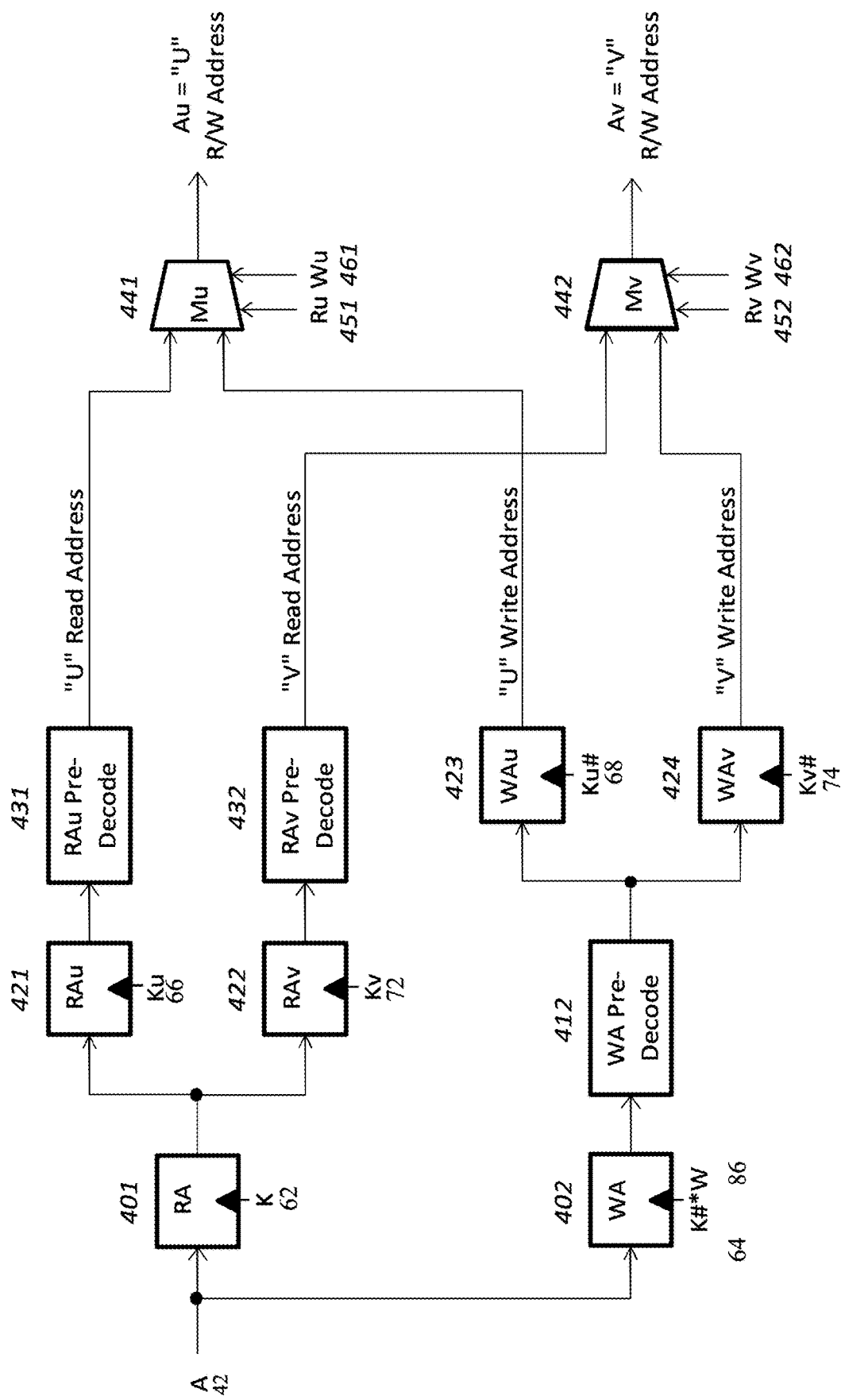
Figure 4: AIPu and AIPv Block Diagram – Version #1, Without Write Buffering

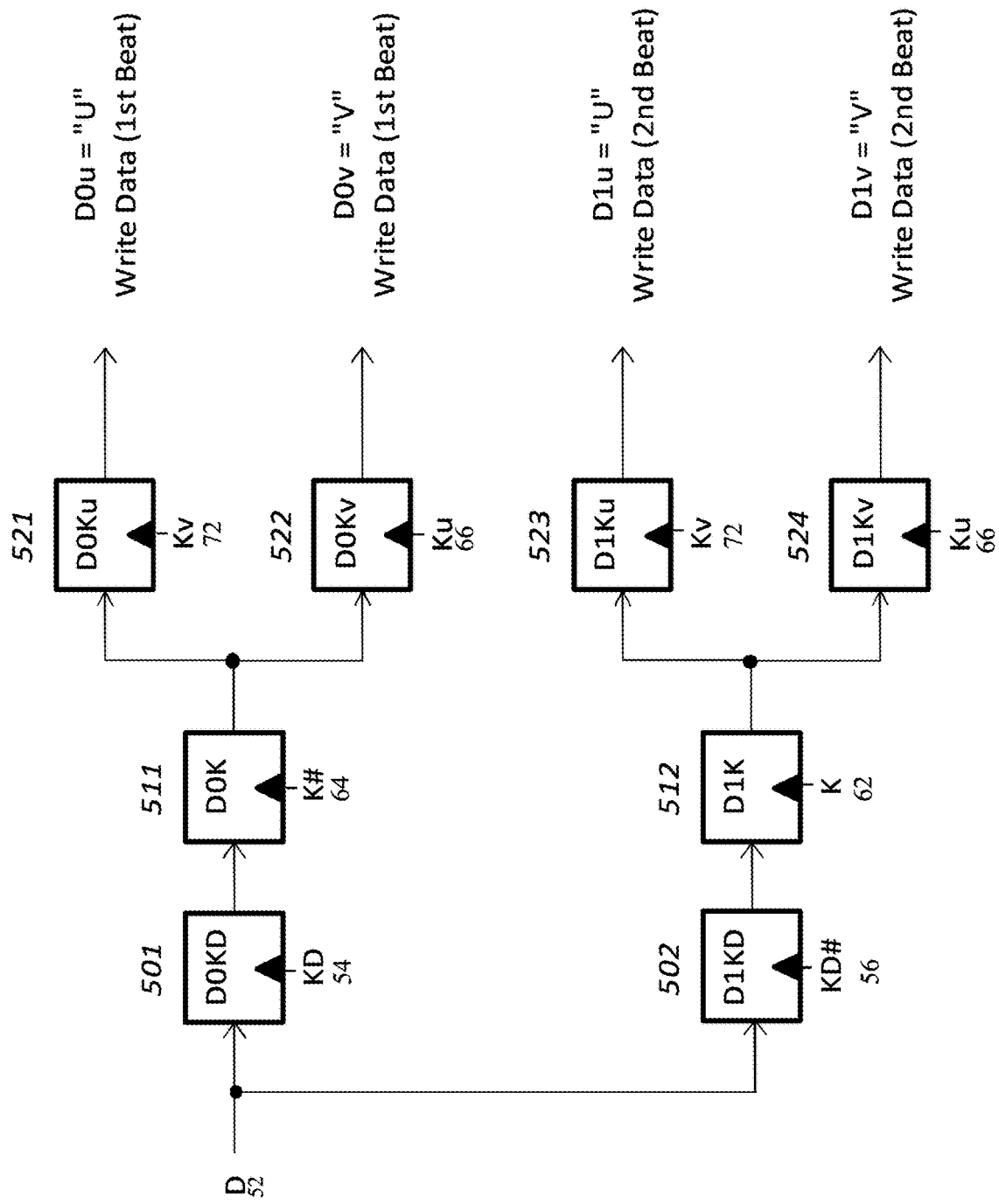
Figure 5: DIPu and DIPv Block Diagram – Version #1, Without Write Buffering

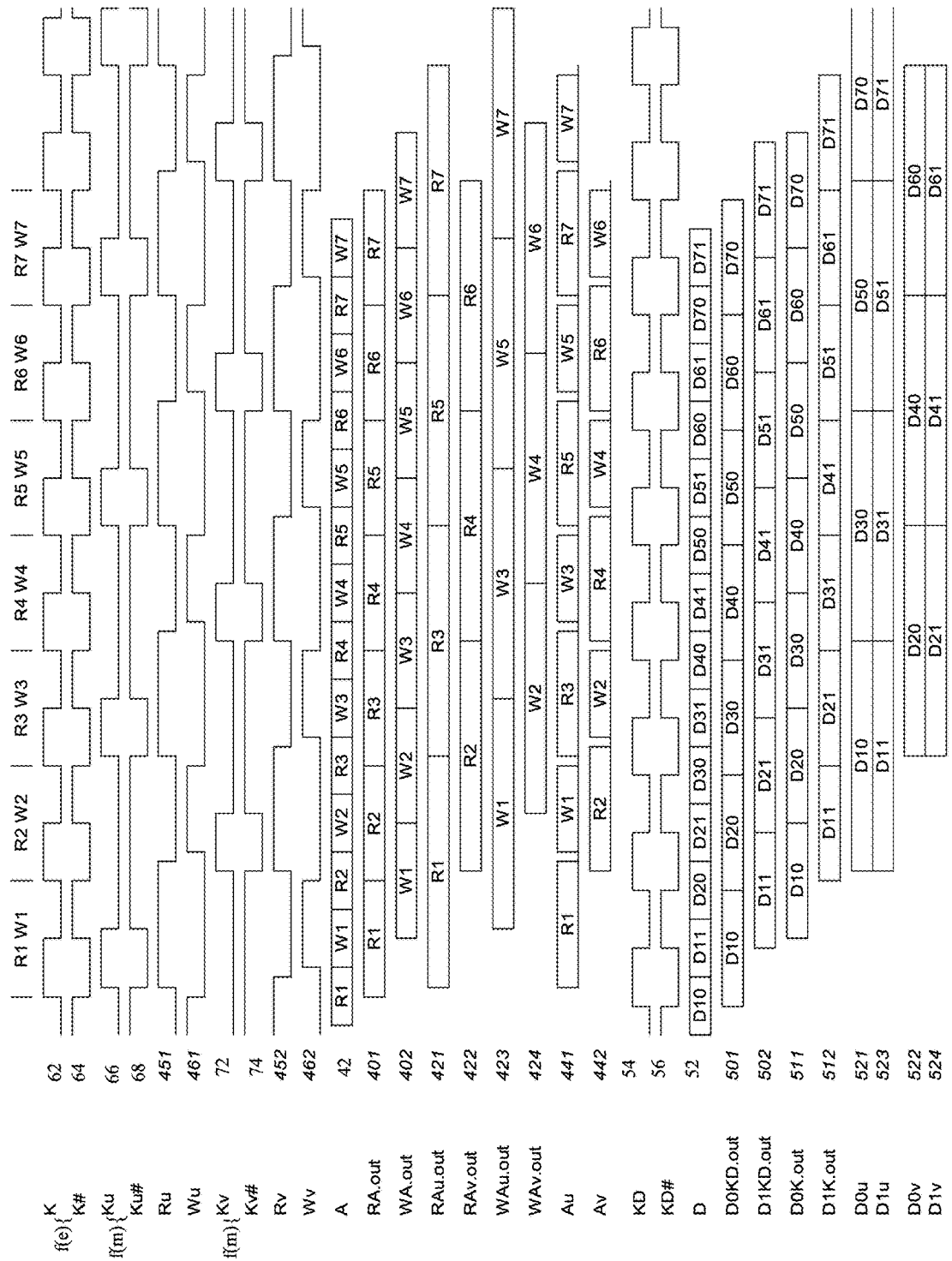
Figure 6: AIPu, AIPv, DIPu, and DIPv Timing Diagram – Version #1, Without Write Buffering

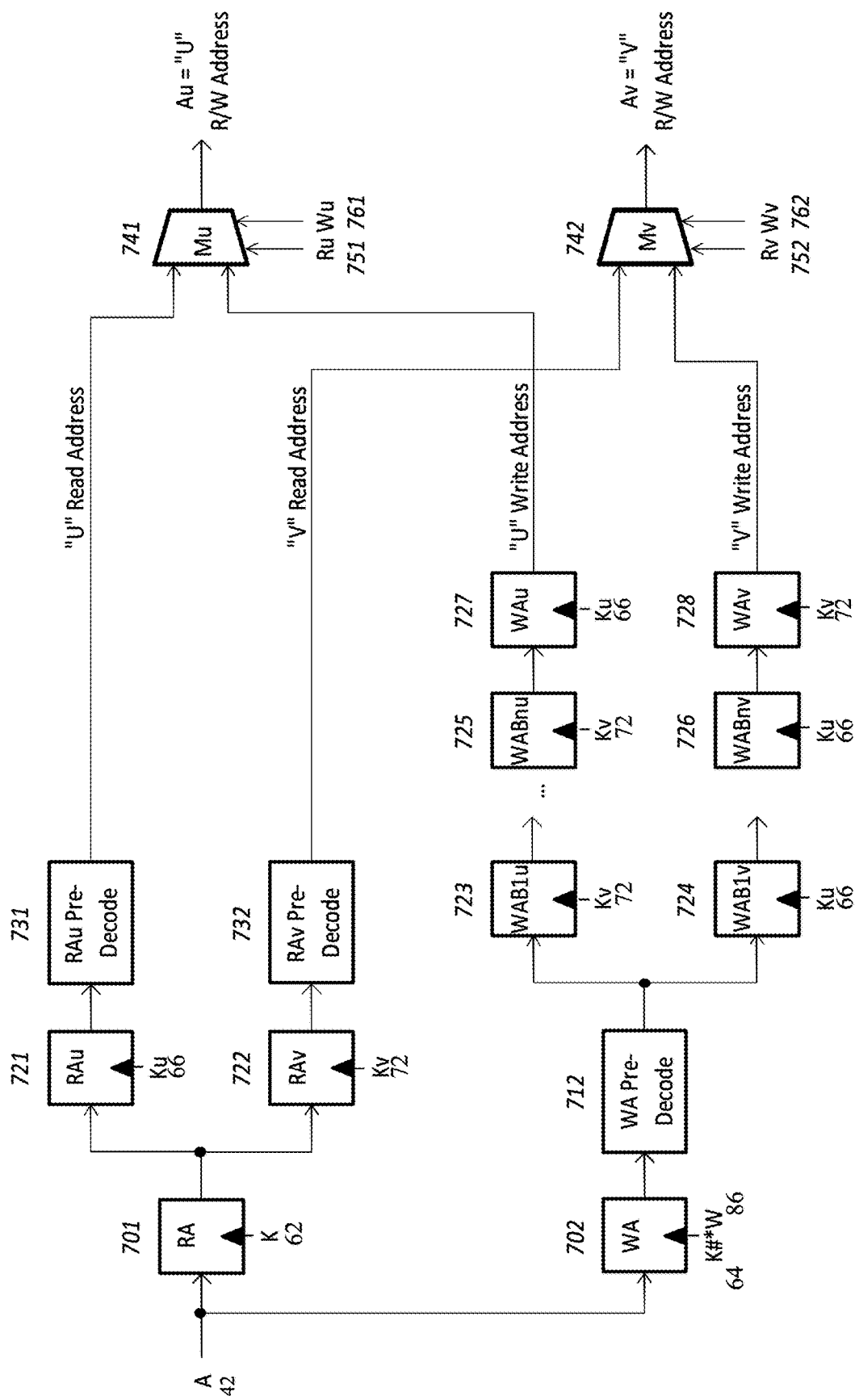
Figure 7: AIPu and AIPv Block Diagram – Version #2, With n-Stage Write Buffering

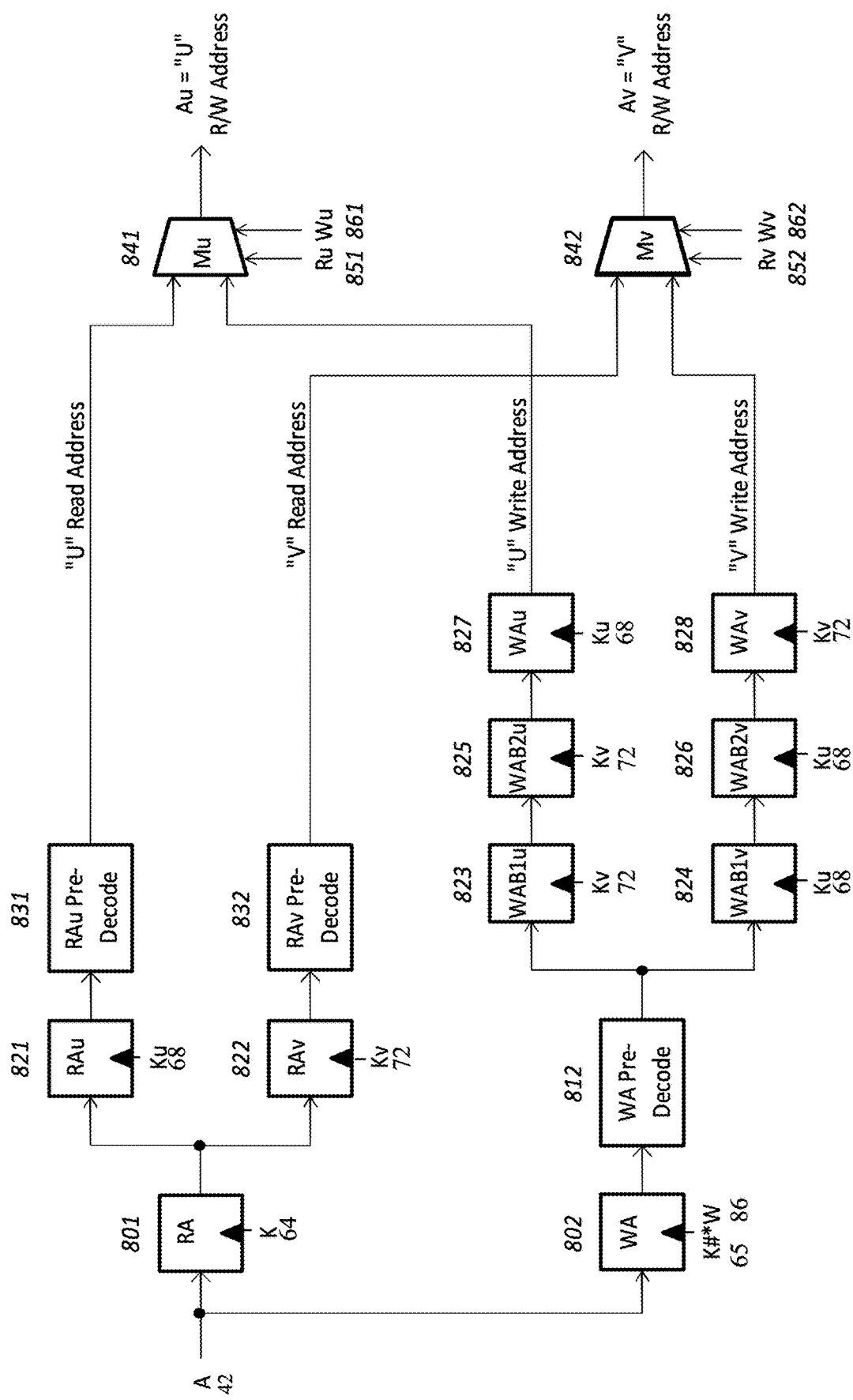
Figure 8: AIPu and AIPv Block Diagram -- Version #2, With 2-Stage Write Buffering

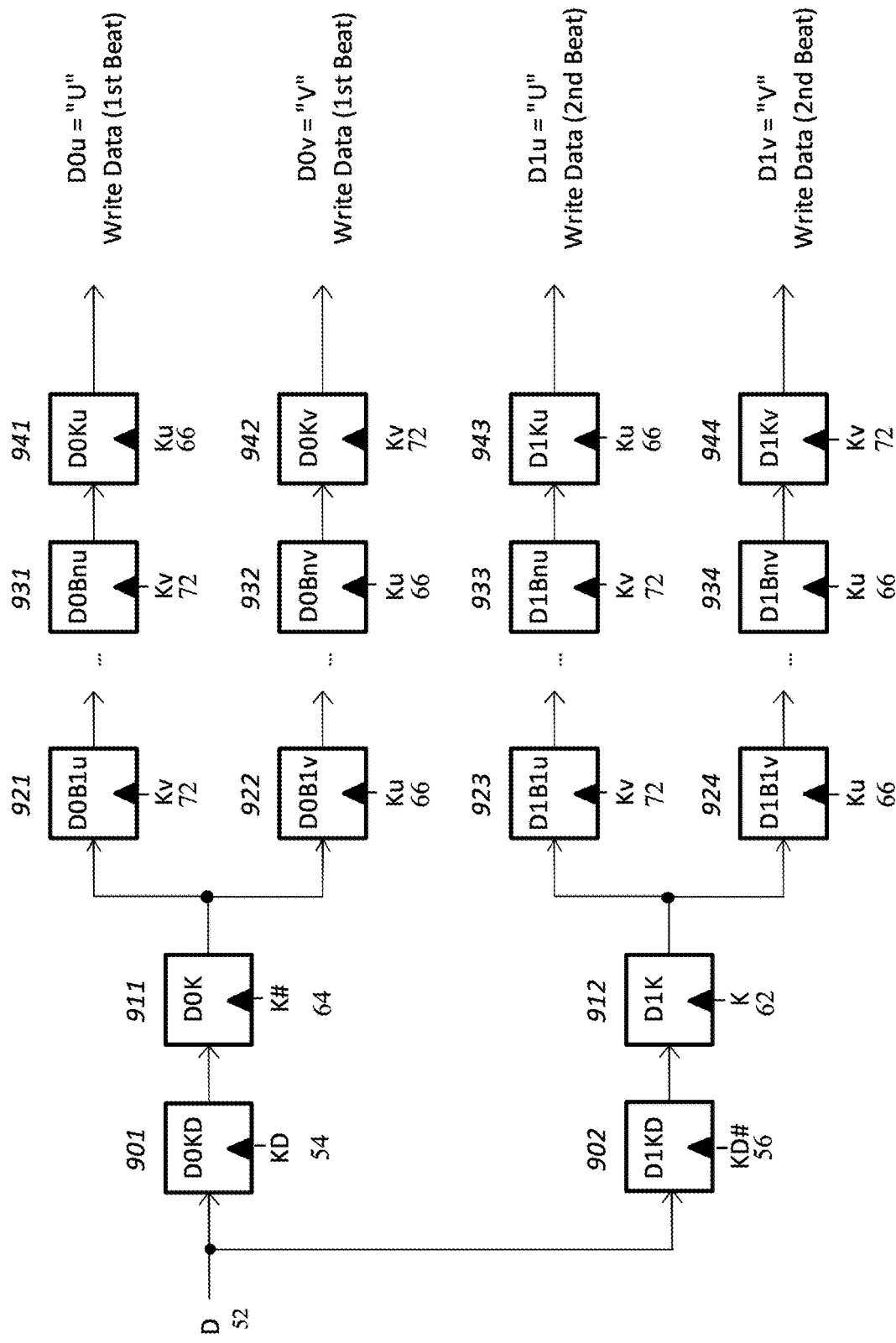
Figure 9: DIPu and DIPv Block Diagram – Version #2, With n-Stage Write Buffering

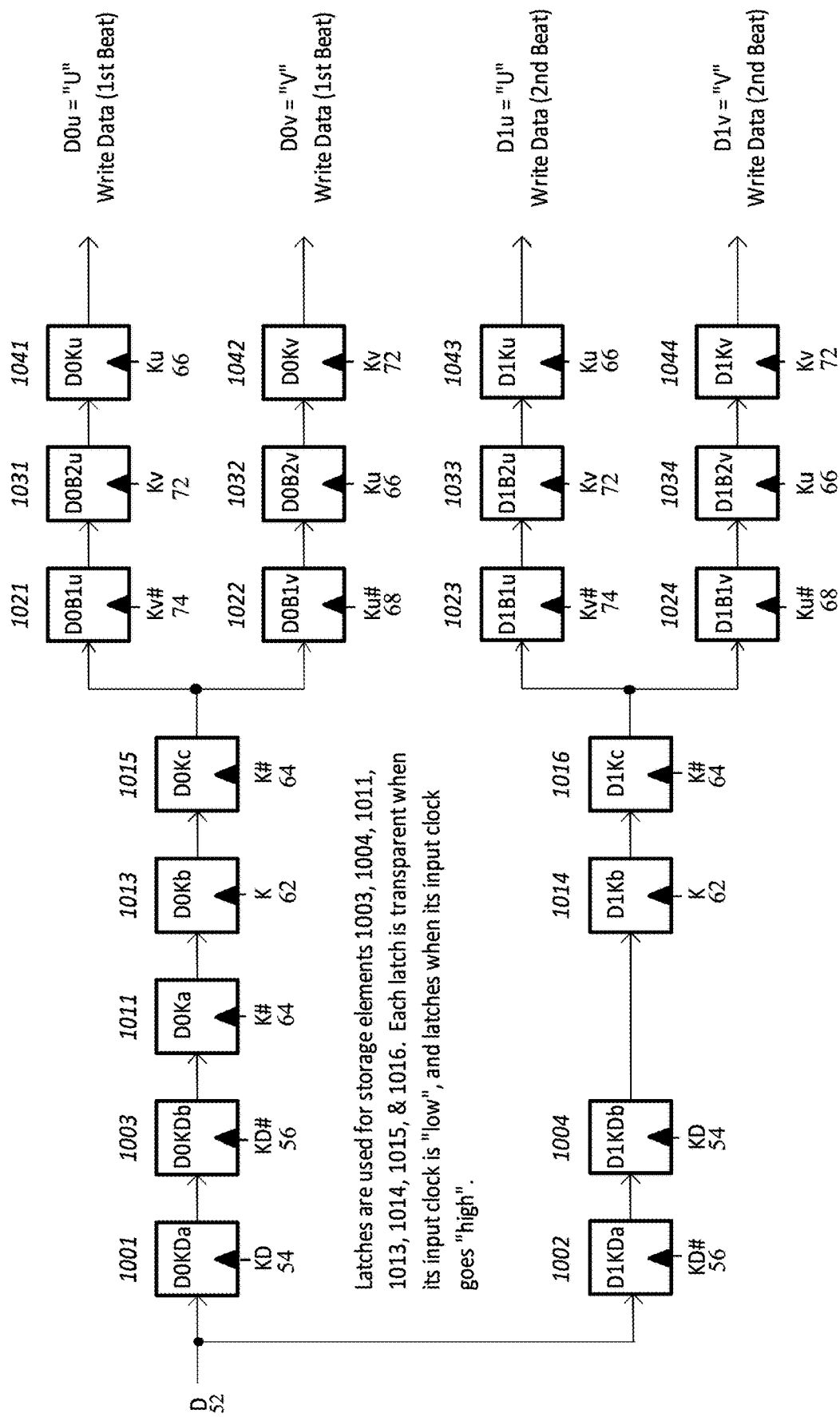
Figure 10: DIPu and DIPv Block Diagram – Version #2, With 2-Stage Write Buffering

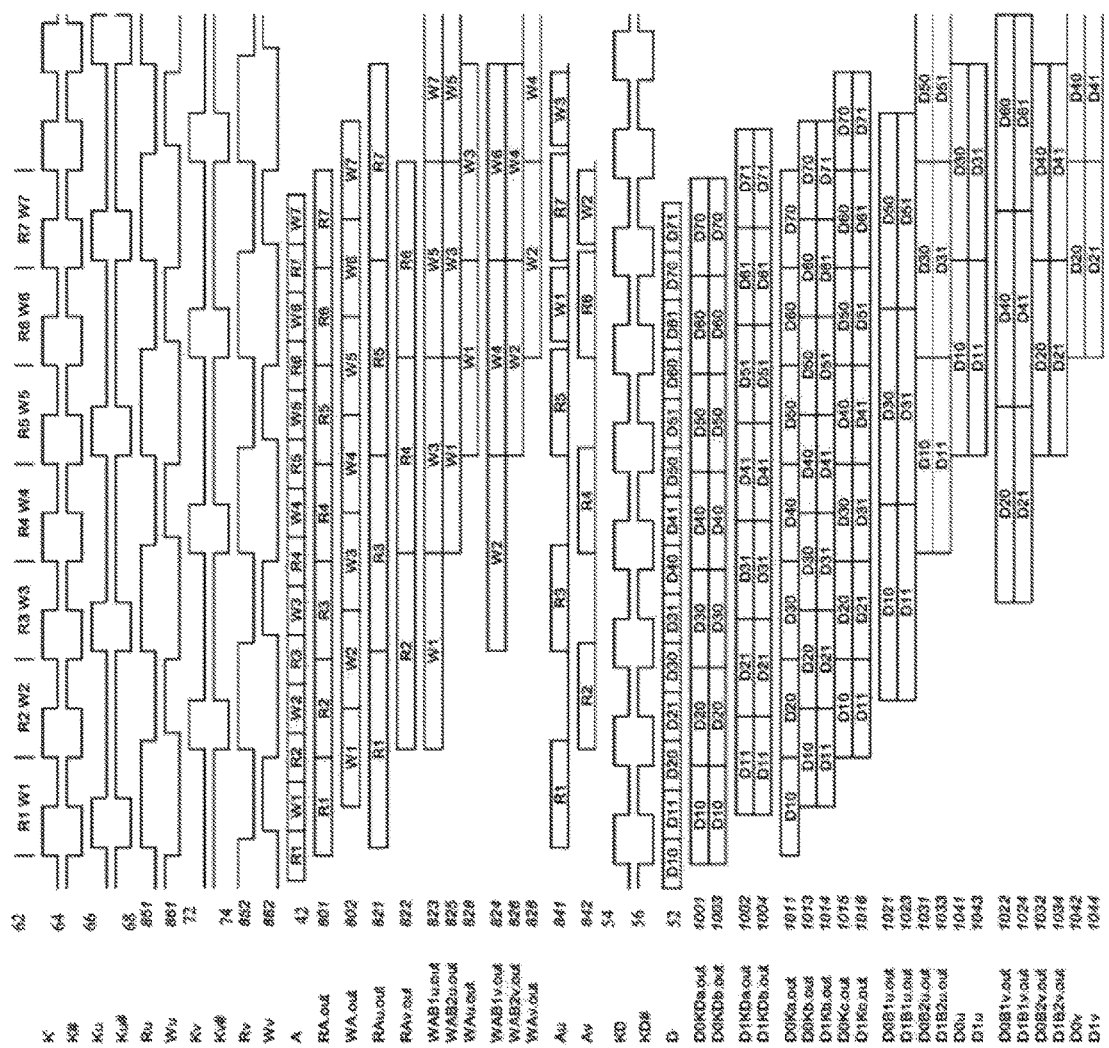
Figure 11: AIPu, AIPv, DIPu, and DIPv Timing Diagram – Version #2, With 2-Stage Write

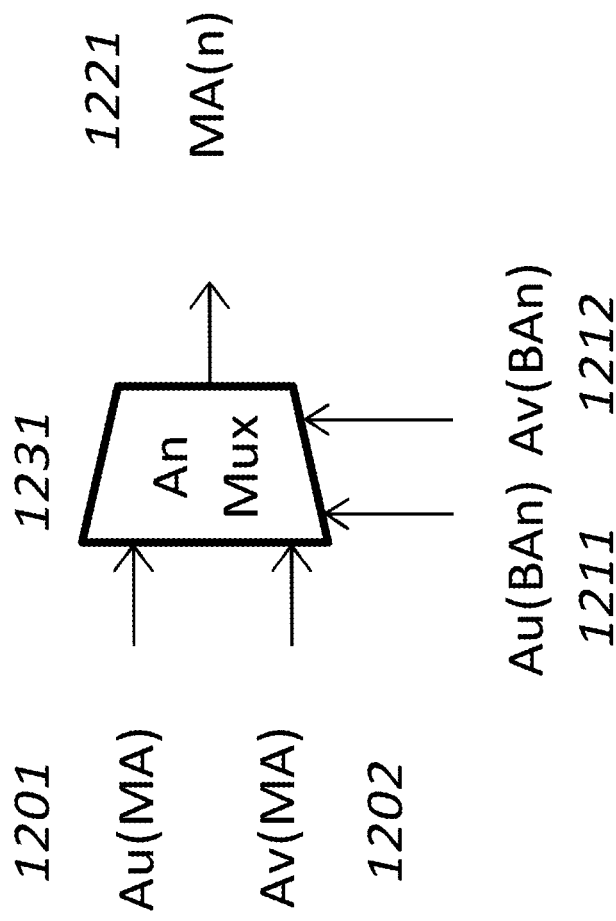
Figure 12: Address Mux to Memory Bank "n"

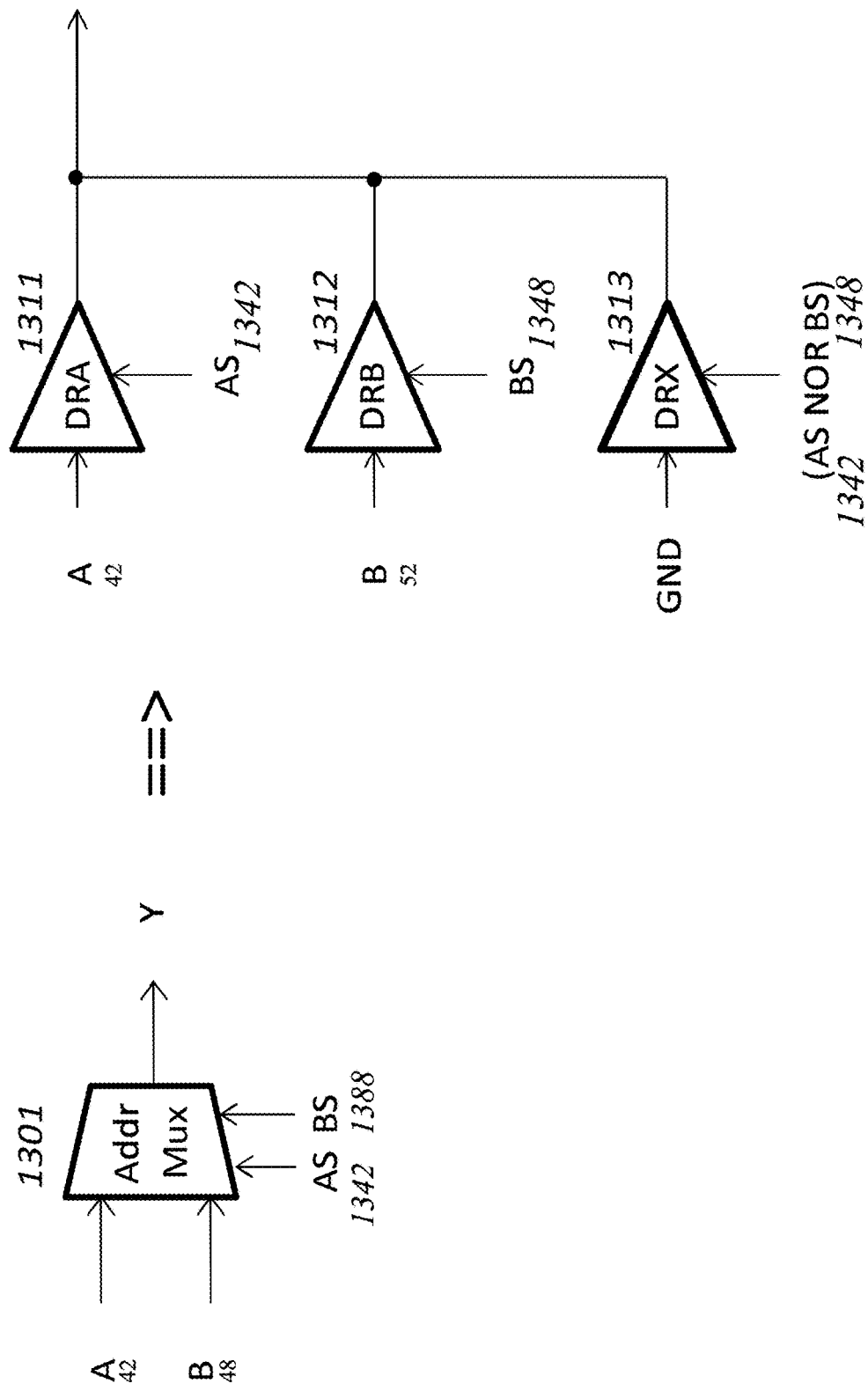
Figure 13: Address Mux Implementation

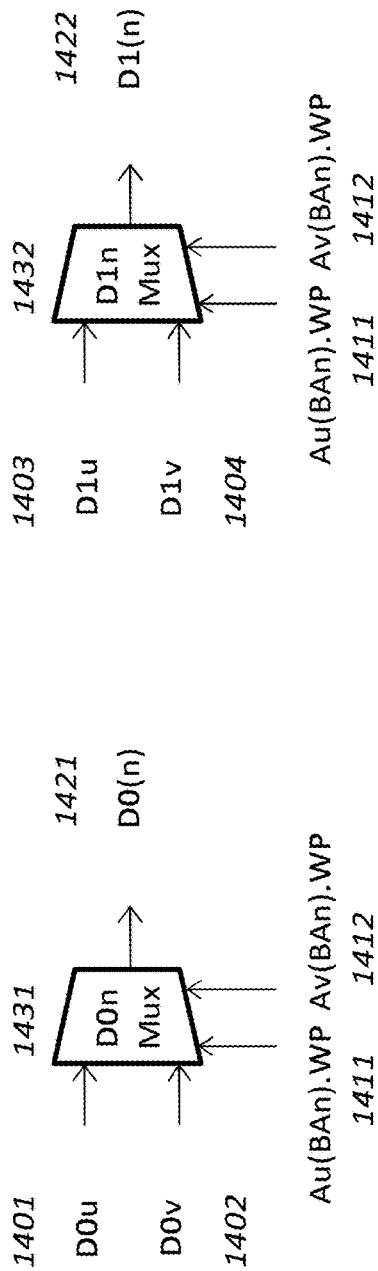
Figure 14: Write Data Muxes to Memory Bank "n"
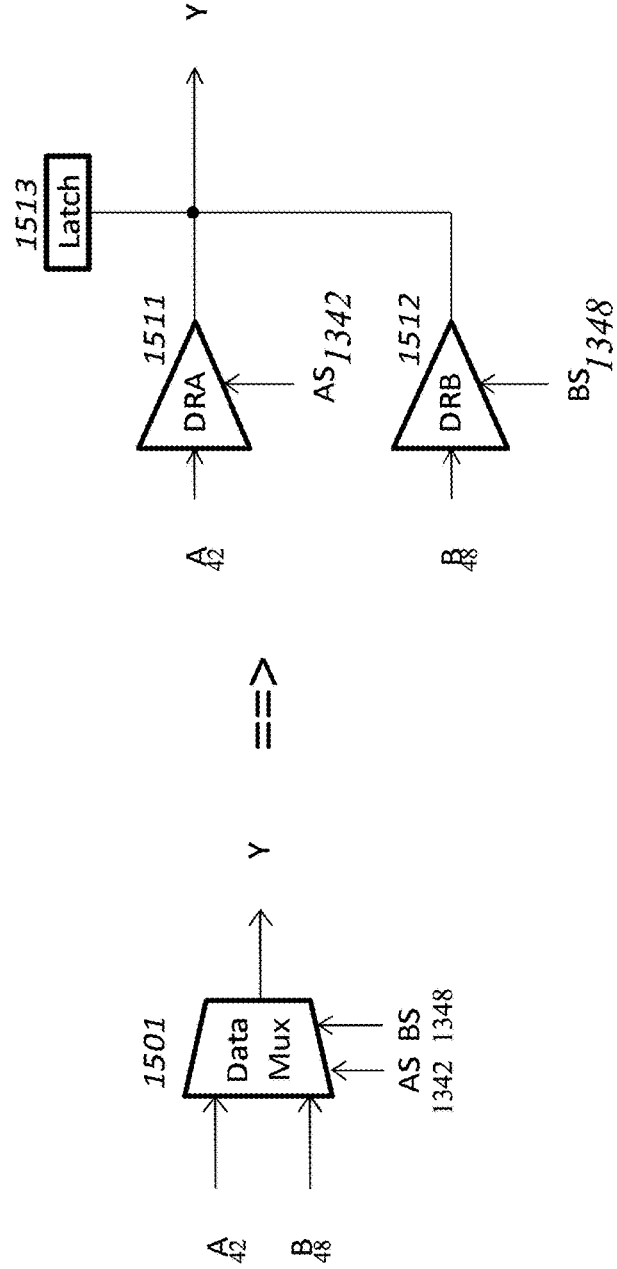
Figure 15: Write Data Mux Implementation

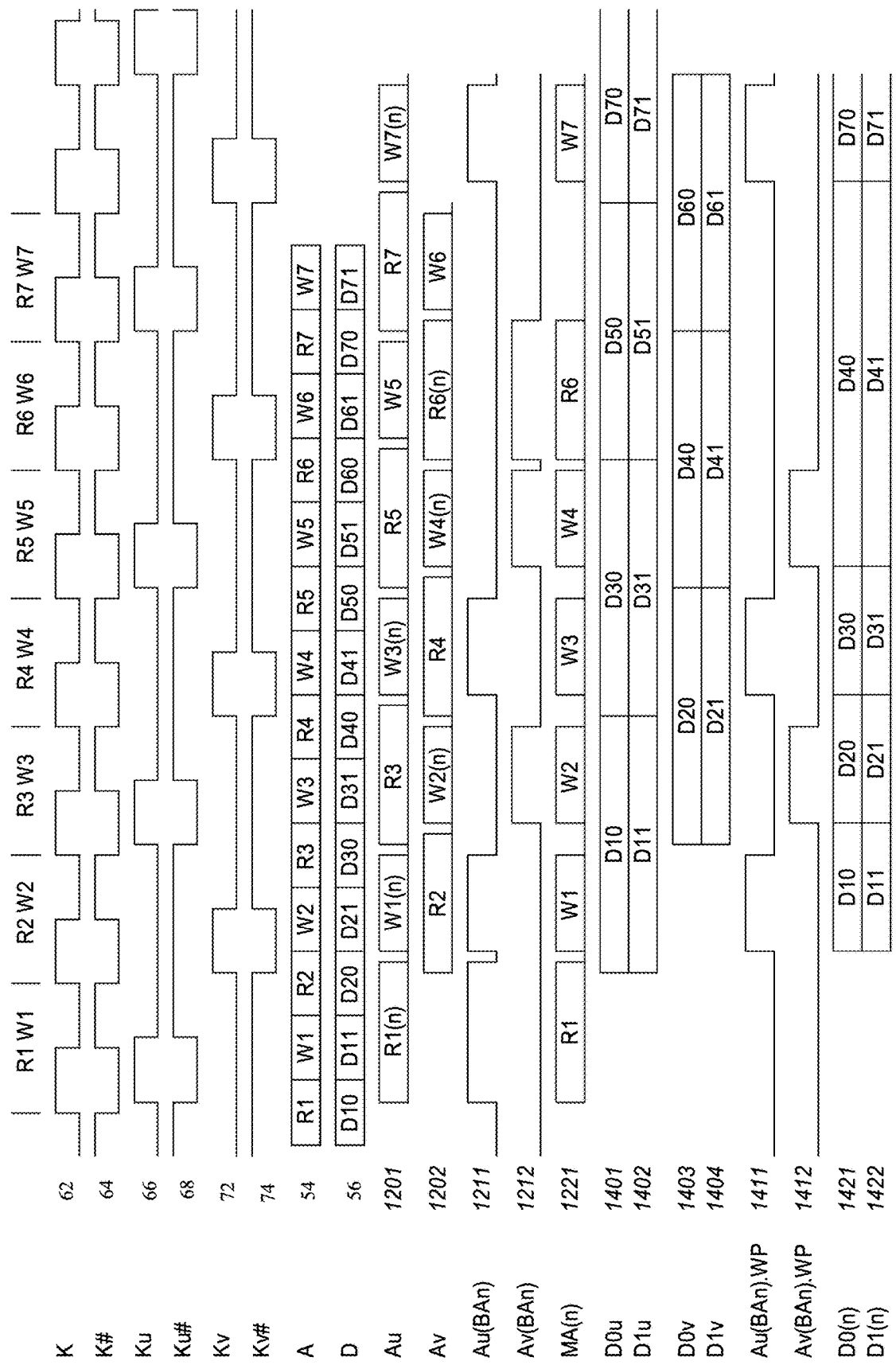
Figs. 16-17: Bank "n" Read Address, Write Address, and Write Data Timing Diagram

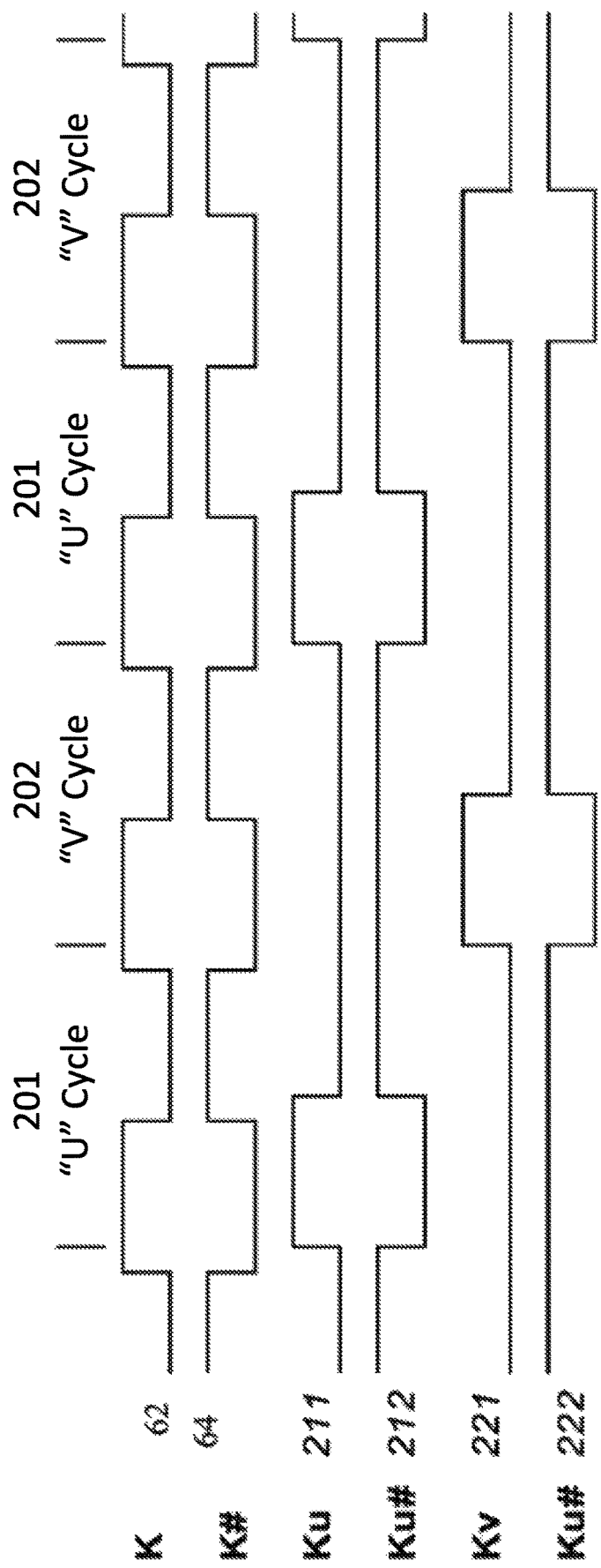
Figure 18: "U" and "V" Clock Cycles, and Ku/Ku# and Kv/Kv# Clocks
PRIOR ART

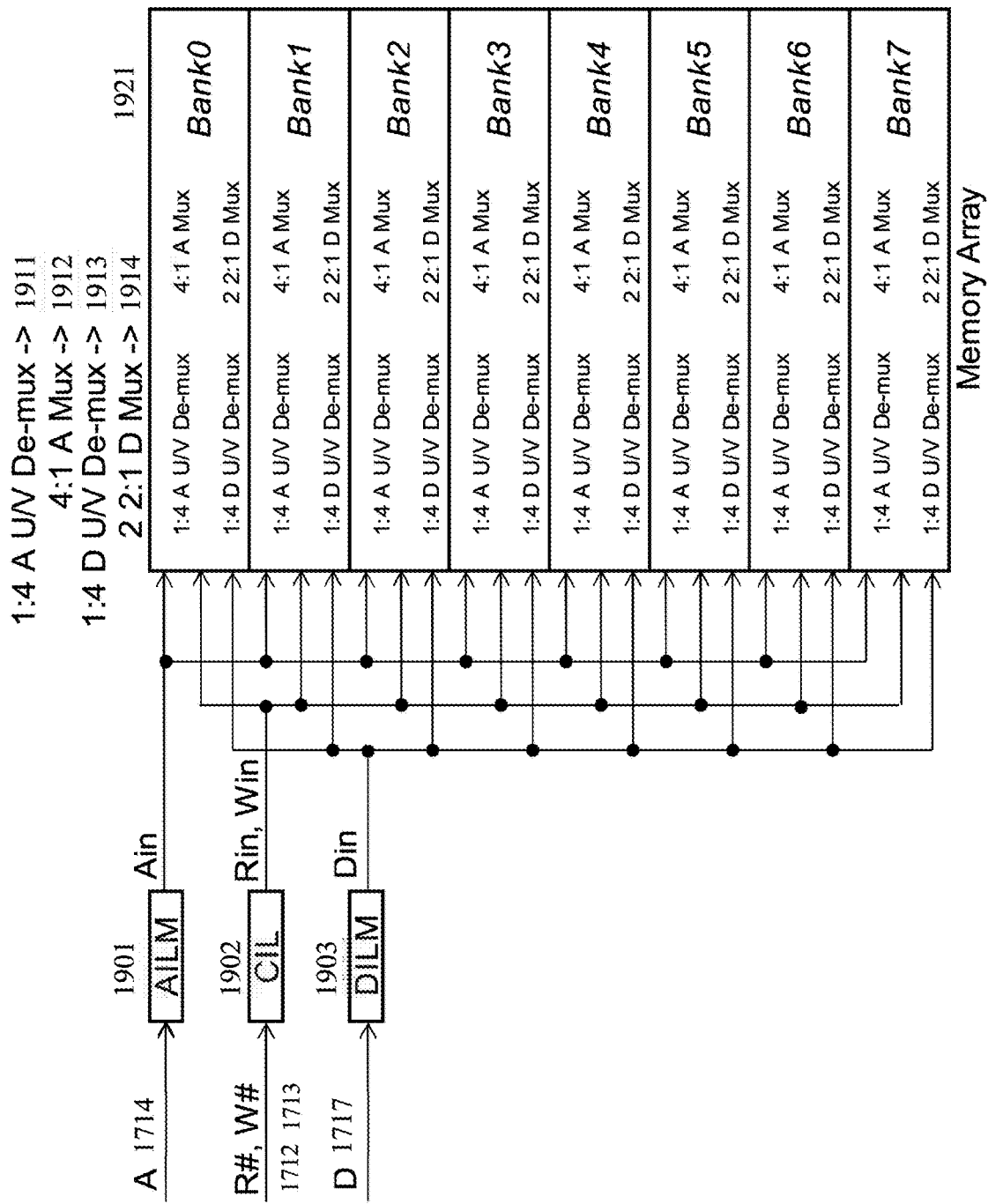
Figure 19: Multi-Bank Dual-Pipe Block Diagram

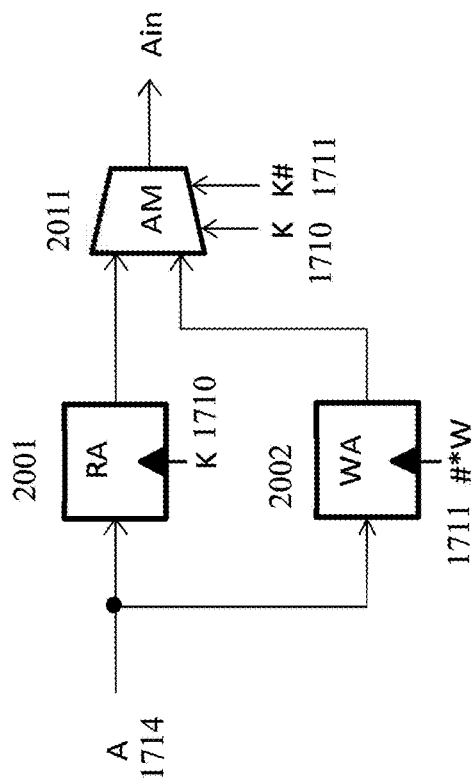
Figure 20: AiLM Block Diagram
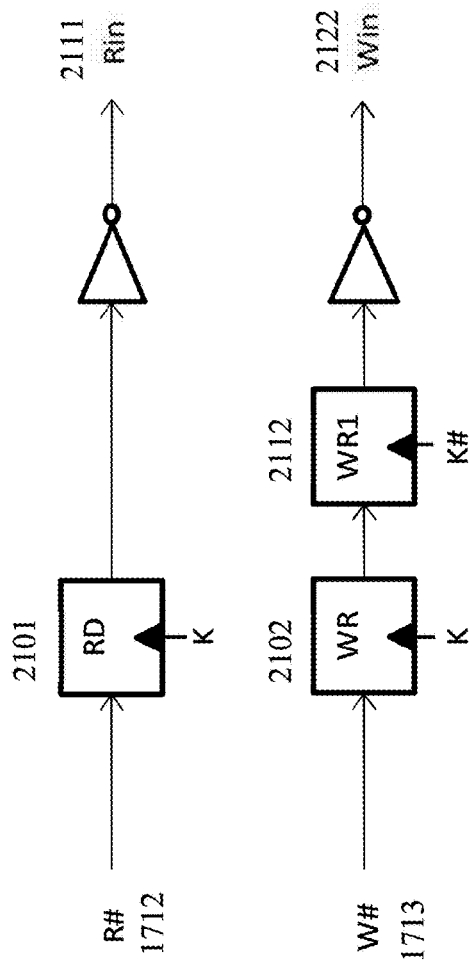
Figure 21: CiL Block Diagram

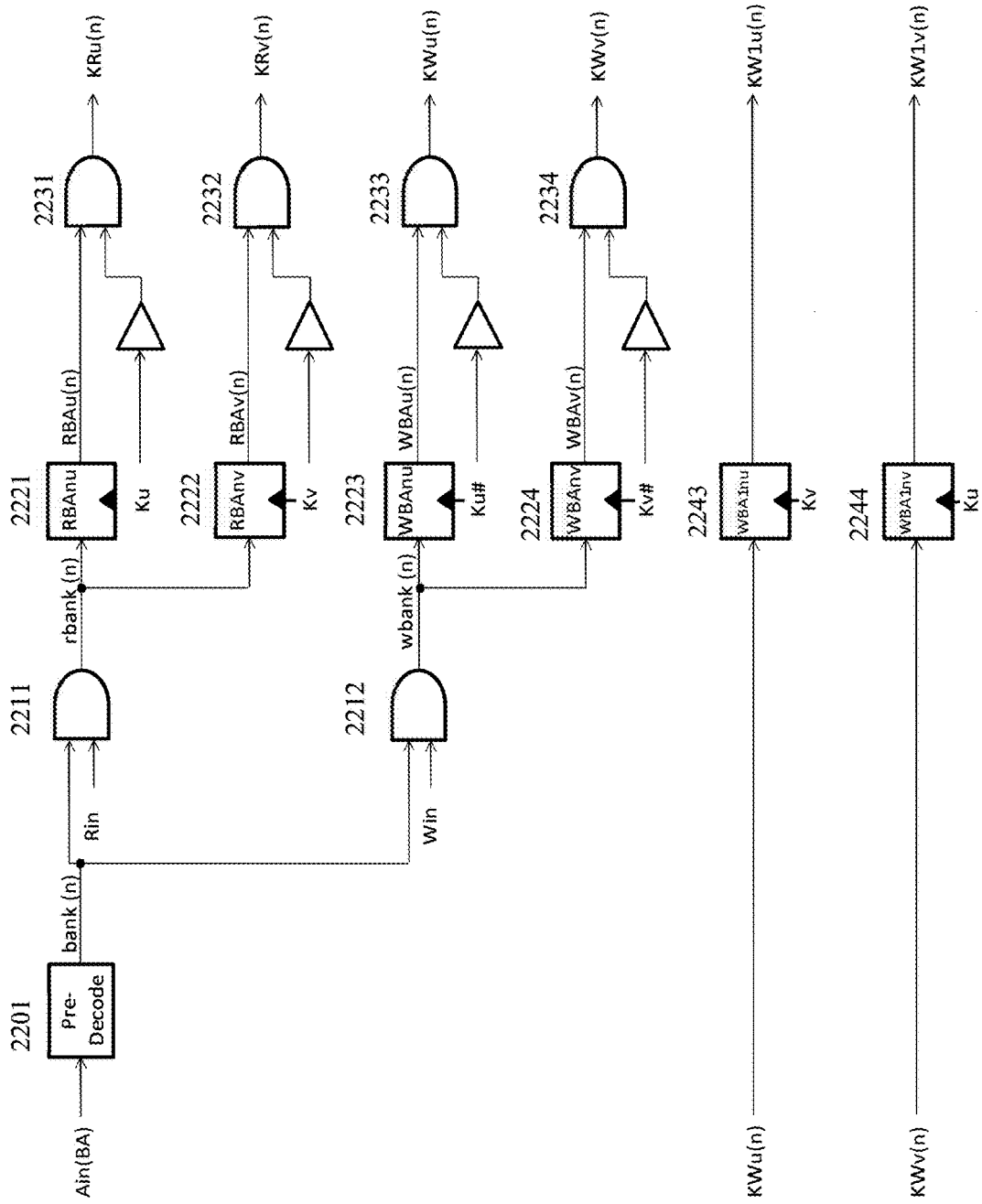
Figure 22: U/V Read and Write Bank Address De-Mux and Clock Generation to Bank "n"

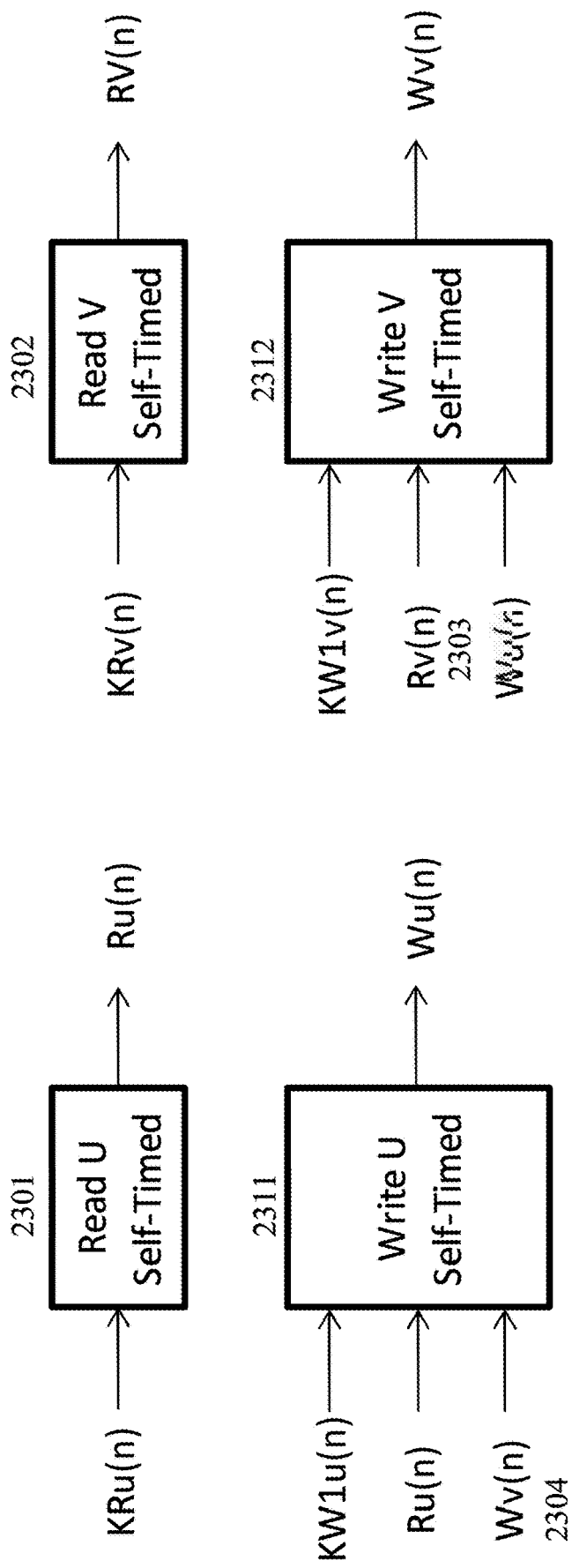
Figure 23: U/V Read and Write Pulse Generation to Bank "n"

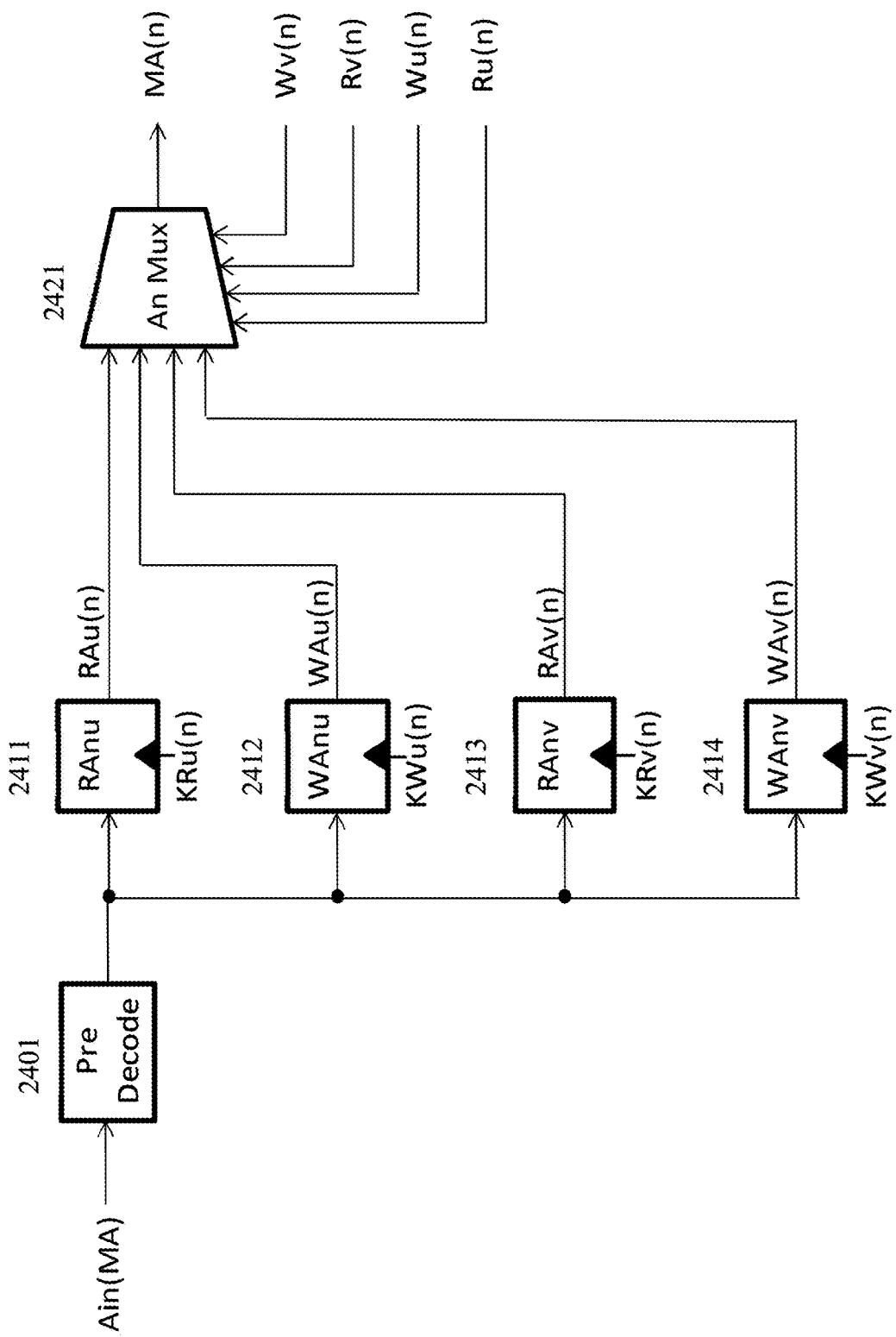
Figure 24: U/V Read and Write Non-Bank Address De-Mux and Mux to Bank "n"

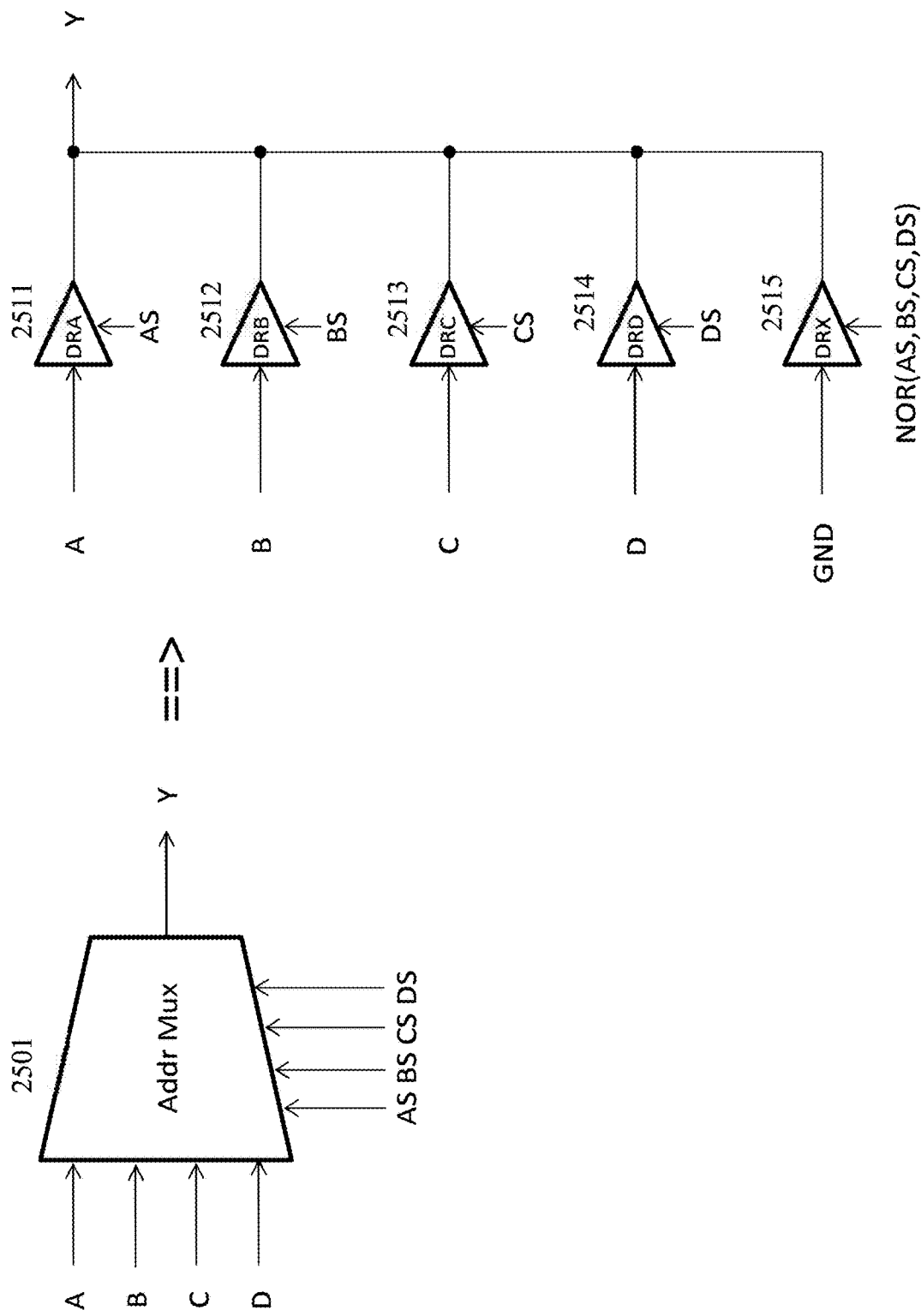
Figure 25: Address Mux Implementation

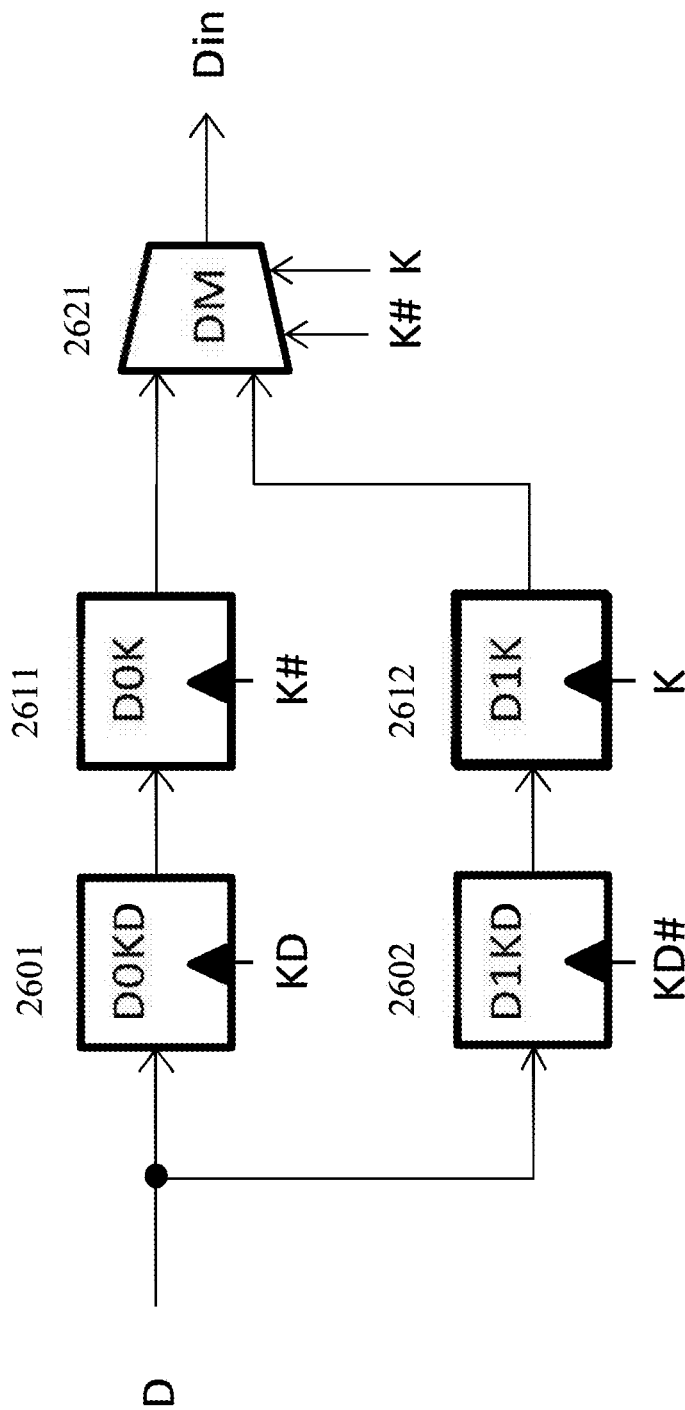
Figure 26: DILM Block Diagram

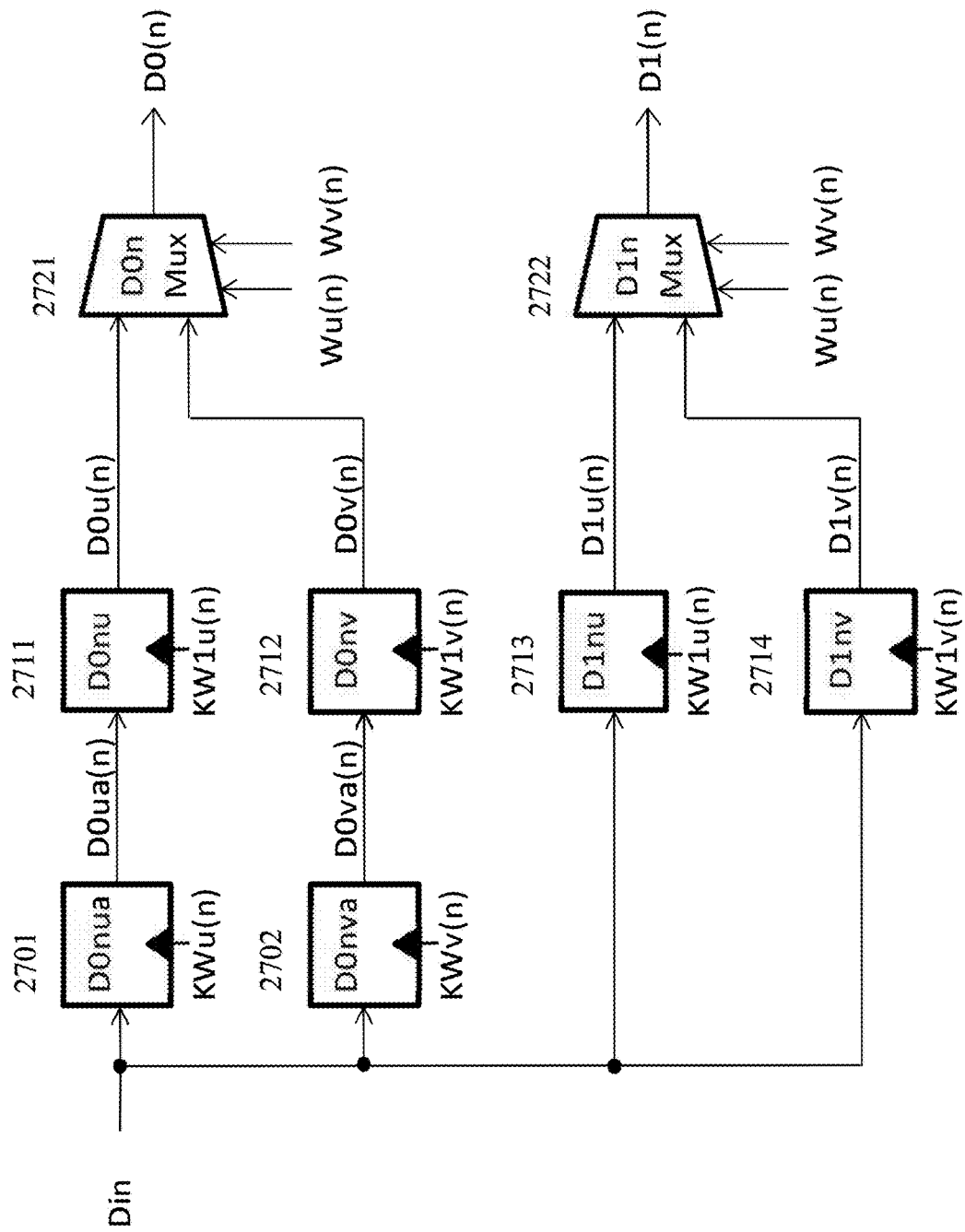
Figure 27: U/V Write Data De-Mux and Mux to Bank "n"

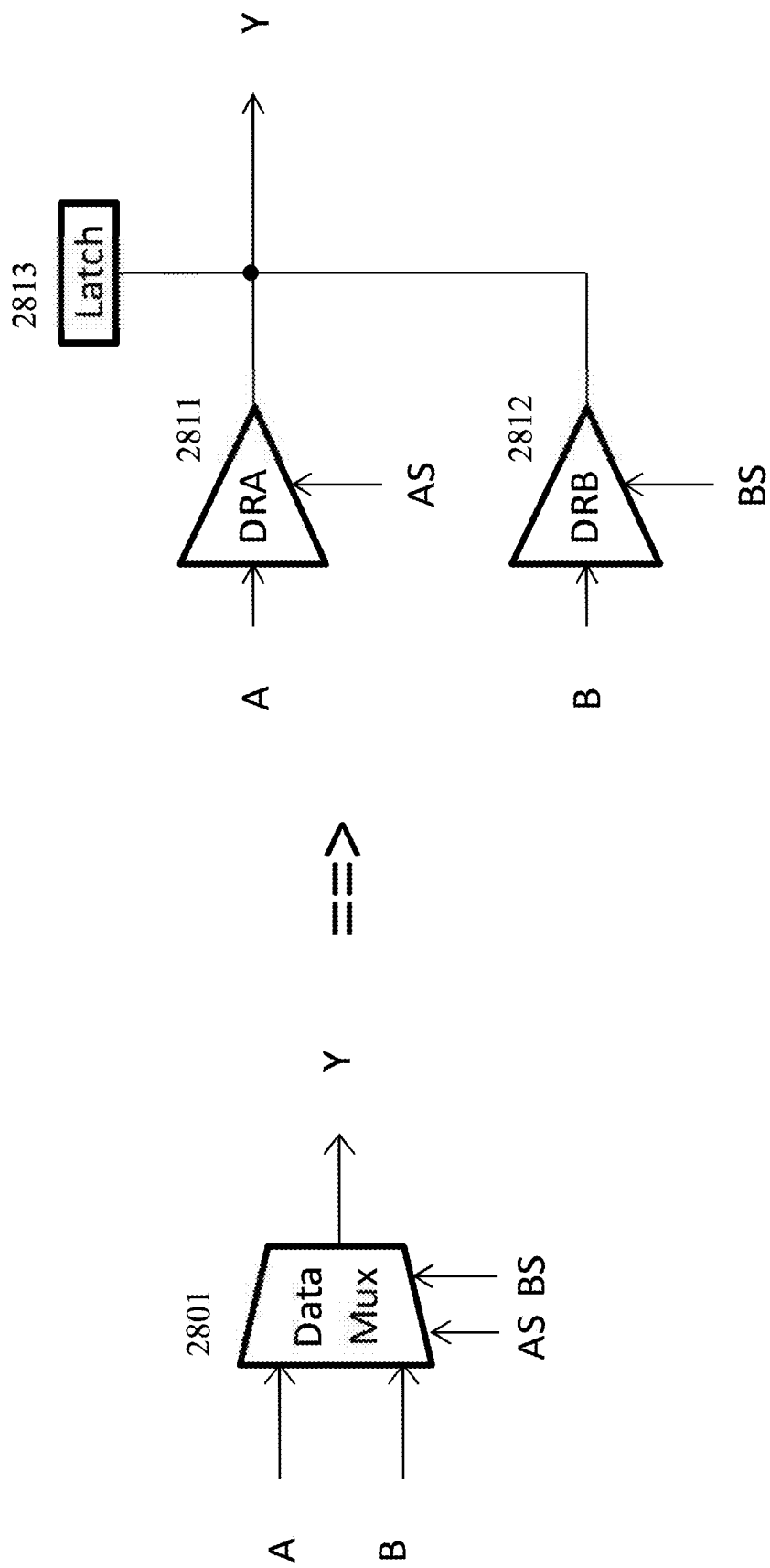
Figure 28: Write Data Mux Implementation

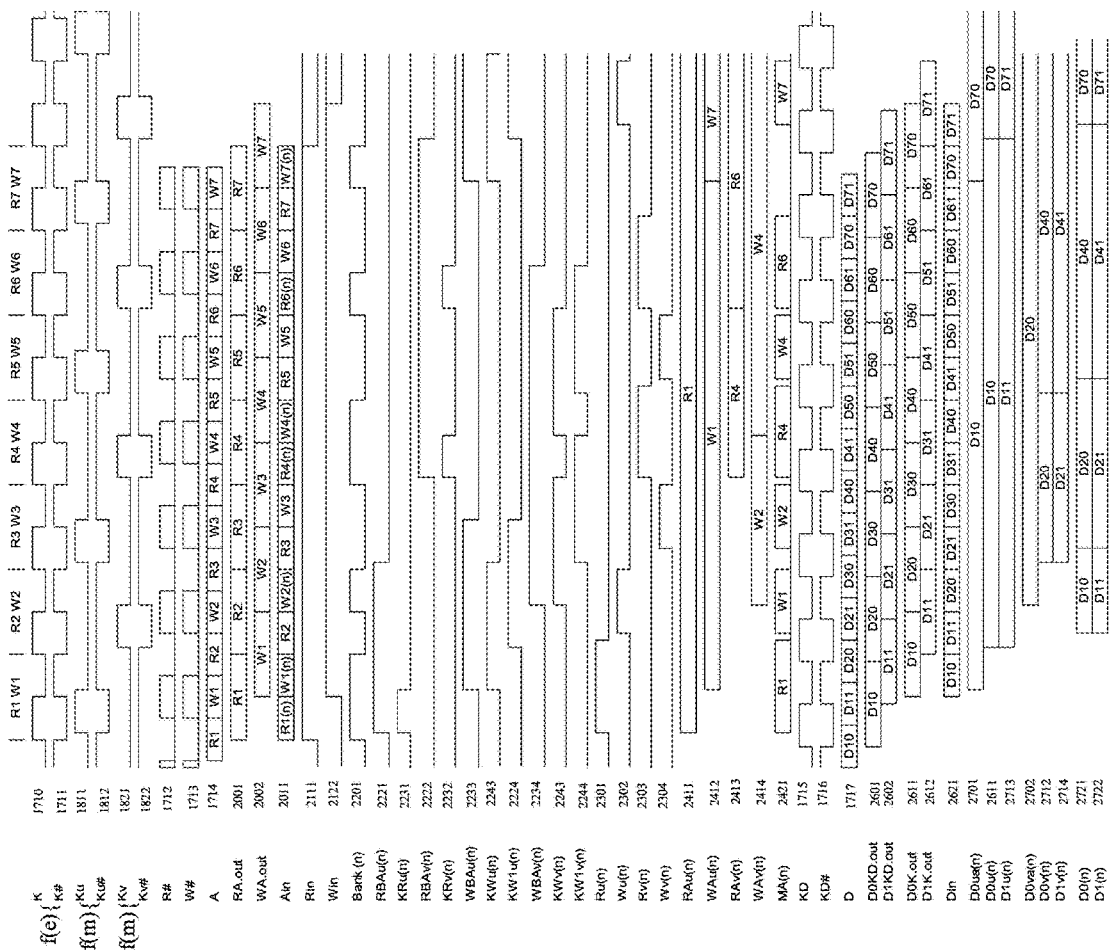
Figure 29: Bank "n" Read Address, Write Address, and Write Data Timing Diagram

SYSTEMS AND METHODS INVOLVING MULTI-BANK, DUAL-PIPE MEMORY CIRCUITRY

CROSS-REFERENCE TO RELATED APPLICATION(S)

This application claims benefit/priority to U.S. provisional patent application Nos. 62/008,447, filed Jun. 5, 2014, and 62/008,449, filed Jun. 5, 2014, which are incorporated herein by reference in entirety.

BACKGROUND

Field

Aspects of the present innovations relate generally to multi-bank memory circuitry, such as dual-pipe memory circuitry, and, more specifically, to systems and method involving capturing and propagating addresses and write data through multi-bank, dual-pipe memory circuitry.

Description of Related Information

In Quad-B2 SRAMs, by way of example, the two operations of a read and a write may be initiated per clock cycle, and two beats of data are transferred per operation per clock cycle (i.e. data transfers are DDR—double data rate). As is well-known in the art, a number of bits transferred per beat is a function of memory bandwidth (e.g., memory bus width or line width, such that a memory with a 64 bit line width can transfer 64 bits per beat).

As depicted in FIG. 1, a read operation is initiated by synchronously asserting the R# control pin "low" 101 at the rising edge of the K input clock 62, and by synchronously providing the read address 103 on the A address pins at the rising of the K input clock 62. The read operations may repeat for each cycle of K input clock 62 (e.g., Read 1 operation may be initiated by synchronously asserting the R# control pin "low" 101 at the rising edge of the K input clock 62 and by synchronously providing the read address 103 on the A address pins at the rising of the K input clock 62 during Cycle #1 of K input clock 62, Read 2 operation may be initiated by synchronously asserting the R# control pin "low" 101 at the rising edge of the K input clock 62 and by synchronously providing the read address 103 on the A address pins at the rising of the K input clock 62 during Cycle #2 of K input clock 62, Read 3 operation may be initiated by synchronously asserting the R# control pin "low" 101 at the rising edge of the K input clock 62, and by synchronously providing the read address 103 on the A address pins at the rising of the K input clock 62 during Cycle #3 of K input clock 62, etc.).

A write operation is initiated by synchronously asserting the W# control pin "low" 102 at the rising edge of the K input clock 62, by synchronously providing the write address on the A address pins at the rising of the K# input clock 64 a half cycle later 104, by synchronously providing the first beat of write data on the D data pins 105 at the rising edge of the KD input clock 54, and by synchronously providing the second beat of write data on the D data pins at the rising edge of the KD# input clock 56 a half cycle later 106. These write operations may repeat for each cycle of K input clock 62 (e.g., write operation D10 and write operation D11 during Cycle #1 of K input clock 62, write operation D20 and write operation D21 during Cycle #2 of K input clock 62, write operation D30 and write operation D31 during Cycle #3 of K input clock 62, etc.).

Note that K# input clock 64 is the inverse of K input clock 62, and KD# input clock 56 is the inverse of KD input clock 54. K and K# are nominally 180 degrees out of phase, as are KD and KD#, but both pairs of clocks are allowed to have some amount of phase offset away from 180 degrees. KD/KD# can either be mesochronous with, or physically the same as, K/K#. When KD/KD# are mesochronous with K/K#, they are the same frequency and are generated from the same source clock, but are allowed to have some amount of phase offset.

In some instances, a Quad-B2 SRAM is architected as a multi-bank dual-pipe device (see U.S. patent application Ser. No. 13/327,721) such that, as pairs of read and write operations are initiated on a cycle-by-cycle basis, the pairs are processed alternately between two sets of pipelines operating at half the frequency of the SRAM clock. In the subsequent descriptions, the letters "U" and "V" are used to denote and distinguish between the two pipelines.

In order to facilitate the dual-pipe nature of various such implementation(s), and as illustrated in FIG. 18, alternating clock cycles are arbitrarily designated first clock cycle "U" 201 and second clock cycle "V" 202 internally. First pipeline clock Ku and second pipeline clock Ku# are generated internally, each of which is half the frequency of the K/K# input clocks. First pipeline clock Ku 211 is only high for the first half of "U" cycles, and second pipeline clock Ku# 212 is the inverse of clock Ku. Third pipeline clock Kv and fourth pipeline clock Kv# are generated internally, each of which is half the frequency of the K/K# input clocks. Third pipeline clock Kv 221 is only high for the first half of "V" cycles, and fourth pipeline clock Kv# 222 is the inverse of third pipeline clock Kv. The designation of cycles as "U" and "V" is entirely transparent to the user. That is, the user does not have to know how the cycles are designated internally in order to use the SRAM.

DESCRIPTION OF THE DRAWINGS

The accompanying drawings, which constitute a part of this specification, illustrate various implementations and aspects of the innovations herein and, together with the description, help illustrate the principles of the present inventions. In the drawings:

FIG. 3 is a block diagram depicting illustrative a multi-bank, dual-pipe memory circuitry, consistent with one or more aspects of the innovations herein.

FIG. 4 is a block diagram depicting illustrative address input circuitry, consistent with one or more aspects of the innovations herein.

FIG. 5 is a block diagram depicting illustrative data input circuitry, consistent with one or more aspects of the innovations herein.

FIG. 6 is a timing diagram depicting illustrative address input and data input circuitry, consistent with one or more aspects of the innovations herein.

FIG. 7 is a block diagram depicting illustrative address input circuitry, consistent with one or more aspects of the innovations herein.

FIG. 8 is a block diagram depicting illustrative address input circuitry, consistent with one or more aspects of the innovations herein.

FIG. 9 is a block diagram depicting illustrative data input circuitry, consistent with one or more aspects of the innovations herein.

FIG. 10 is a block diagram depicting illustrative data input circuitry, consistent with one or more aspects of the innovations herein.

FIG. 11 is a timing diagram depicting illustrative address input and data input circuitry, consistent with one or more aspects of the innovations herein.

FIG. 12 is a block diagram depicting illustrative an address multiplexer, consistent with one or more aspects of the innovations herein.

FIG. 13 is a block diagram depicting illustrative an address multiplexer, consistent with one or more aspects of the innovations herein.

FIG. 14 is a block diagram depicting illustrative a data multiplexer, consistent with one or more aspects of the innovations herein.

FIG. 15 is a block diagram depicting illustrative a data multiplexer, consistent with one or more aspects of the innovations herein.

FIGS. 16-17 are a timing diagram depicting illustrative read and write timing aspects, consistent with one or more aspects of the innovations herein.

FIG. 18 is another timing diagram of an existing memory circuit.

FIG. 19 is a block diagram depicting illustrative a multi-bank, dual-pipe memory circuitry, consistent with one or more aspects of the innovations herein.

FIG. 20 is a block diagram depicting illustrative address input circuitry, consistent with one or more aspects of the innovations herein.

FIG. 21 is a block diagram depicting illustrative control input latch circuitry, consistent with one or more aspects of the innovations herein.

FIG. 22 is a block diagram depicting illustrative de-multiplexer, consistent with one or more aspects of the innovations herein.

FIG. 23 is a block diagram depicting illustrative read/write circuitry, consistent with one or more aspects of the innovations herein.

FIG. 24 is a block diagram depicting illustrative address multiplexer, consistent with one or more aspects of the innovations herein.

FIG. 25 is a block diagram depicting illustrative address multiplexer, consistent with one or more aspects of the innovations herein.

FIG. 26 is a block diagram depicting illustrative data input circuitry, consistent with one or more aspects of the innovations herein.

FIG. 27 is a block diagram depicting illustrative data multiplexer, consistent with one or more aspects of the innovations herein.

FIG. 28 is a block diagram depicting illustrative data multiplexer, consistent with one or more aspects of the innovations herein.

FIG. 29 is a timing diagram depicting illustrative read and write timing aspects, consistent with one or more aspects of the innovations herein.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the present inventions. Instead, they are merely some examples consistent with certain aspects related to the present innovations. Wherever possible, the same reference numbers will be used throughout the drawings to refer to the same or like parts.

Systems and methods for capturing read addresses, write addresses, and write data, and propagating them through dual, half-frequency pipelines to the memory array in multi-bank, dual-pipe Quad-B2 SRAMs are disclosed. Aspects of the present inventions relate to implementations for capturing pairs of read and write addresses, and propagating them to each memory bank through two distinct address input pipelines, each of which operates at half of the external clock frequency of the SRAM. According to some implementations, two beats of write data are captured and transferred per write operation, and are propagated to the each memory bank through two distinct data input pipelines, each of which operates at half of the external clock frequency of the SRAM. Various details on different implementations are set forth below.

At each memory bank, the bank address portion of the read and write address streams from the two address input pipelines are used to determine if the associated read and/or write operation(s) are targeted for that particular bank.

At each memory bank, the non-bank address portion of the read U and write V addresses from the two address input pipelines are used to select the particular location(s) within the bank to be read and/or written, if the associated read and/or write operation(s) are targeted for that particular bank, as determined by the bank address portion of the read and write addresses.

At each memory bank, the appropriate two beats of write data from the two data input pipelines are selected to be stored in the particular location within the bank, as determined by the non-bank address portion of the write addresses, if the associated write operation is targeted for that particular bank, as determined by the bank address portion of the write addresses.

Figure 1:
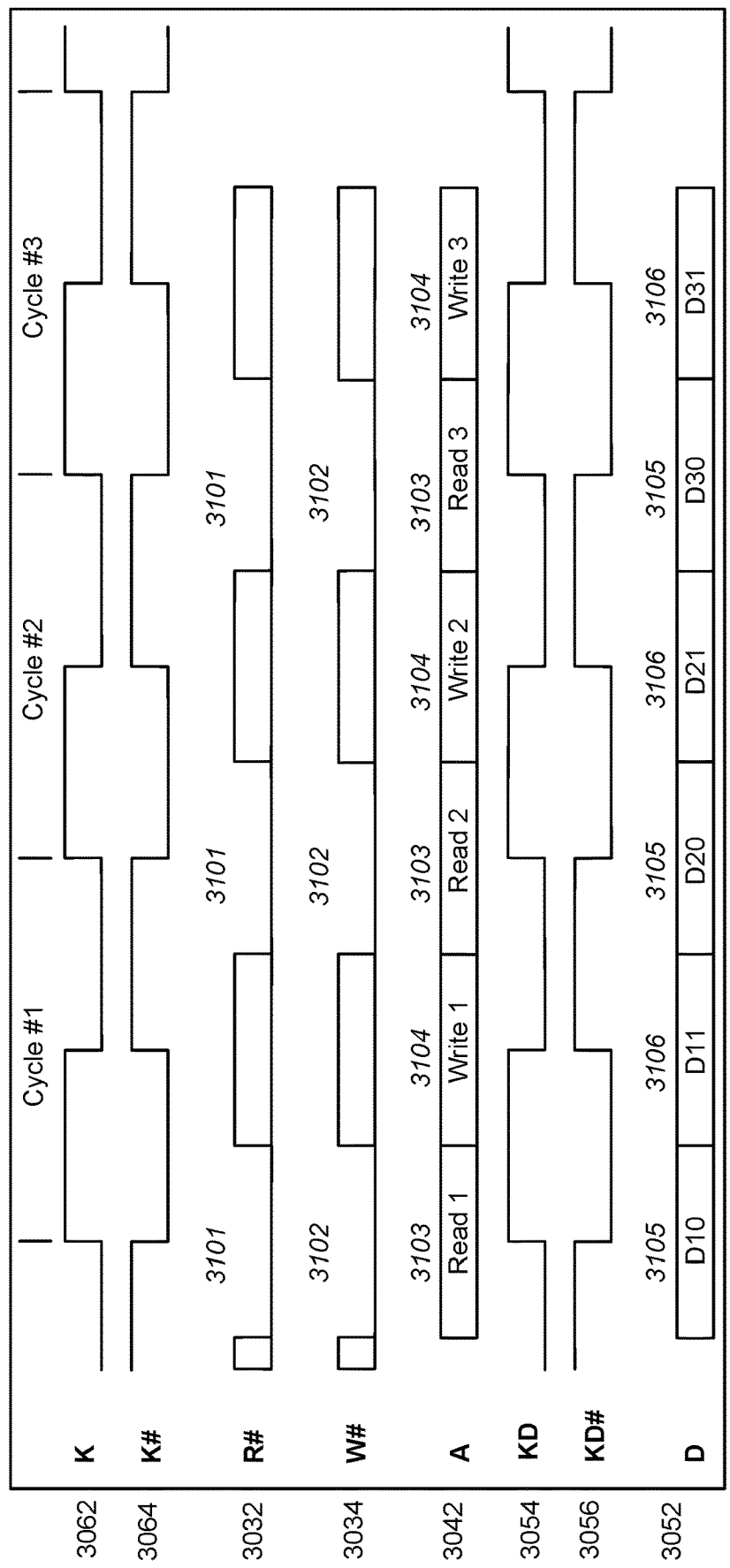
FIG. 1 is a timing diagram of an existing memory circuit.
Figure 2:
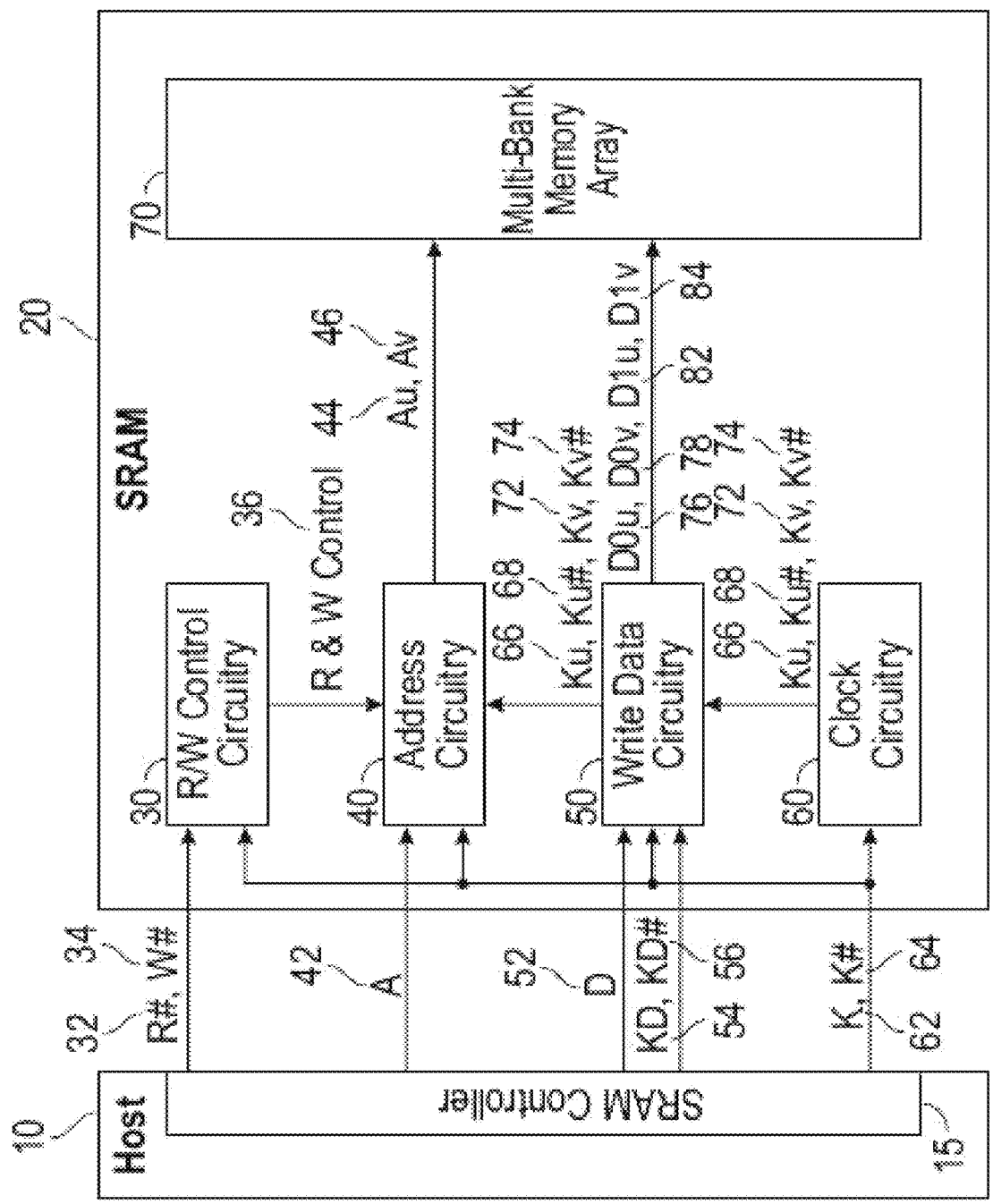
FIG. 2 is a block diagram of an illustrative high-level system, consistent with one or more aspects of the innovations herein.

FIG. 2 is a block diagram of a host 10 and multi-bank memory circuitry 20, consistent with one or more aspects of the innovations herein. The memory circuitry 20 is shown as SRAM in this example, although those of ordinary skill in the art will understand that many other types of memory may be utilized in connection with the various multi-bank memory circuitry set forth herein. The memory circuitry 20 may include a multi-bank memory array 70 in which data may be written and from which data may be read. The memory circuitry 20 may also include read/write (R/W) control circuitry 30, address circuitry 40, write data circuitry 50, and/or clock circuitry 60.

A host 10 may include a memory controller 15 (e.g., a SRAM controller in this example) configured to communicate with the memory circuitry 20. For example, as explained in greater detail below, memory controller 15 may send first read control R# 32 and/or first write control W# 34 signals to R/W control circuitry 30, address signal A 42 to address circuitry 40, data signal D 52 to write data circuitry 50, input clock signals KD 54 and/or KD# 56 to write data circuitry 50, and/or input clock signals K 62 and/or K# 64 to one or more of R/W control circuitry 30, address circuitry 40, write data circuitry 50, and clock circuitry 60.

R/W control circuitry 30, address circuitry 40, write data circuitry 50, and/or clock circuitry 60 may communicate with one another, and address circuitry 40 and/or write data circuitry 50 may communicate with the multi-bank memory array 70. For example, as explained in greater detail below, clock circuitry 60 may supply clock signals Ku 66, Ku# 68, Kv 72, and/or Kv# 74 to write data circuitry 50 and/or address circuitry 50. Additionally, R/W control circuitry 30 may send read and/or write control signals 36 to address circuitry 40. Address circuitry 40 may send address location data Au 44 and/or Av 46 to the multi-bank memory array 70 to specify memory addresses to be read out or written. Write data circuitry may send write data D0u 76, D0v 78, D1u 82, and/or D1v 84 to the multi-bank memory array 70.

FIG. 2 shows a high level example of a host 10 and multi-bank memory circuitry 20 system. The following detailed description provides specific examples of processes and/or components of the system that may provide features and/or advantages involving capturing and propagating addresses and write data through multi-bank memory circuitry 20.

For example, a multi-bank, dual-pipe SRAM device may include a memory array operating a memory array frequency and comprising a plurality of SRAM banks, wherein each SRAM bank includes a block of single port SRAM memory cells organized as a matrix of rows and columns and memory cell access circuitry. The plurality of SRAM banks may be simultaneously active. The memory cell access circuitry may include a first read control input and a first write control input for initiating read and write operations in the same clock cycle for each and every clock cycle. The memory cell access circuitry may also include a first input clock and a second input clock, wherein the second input clock is the inverse of the first input clock.

In some embodiments, the access circuitry may be configured to designate alternating clock cycles as a first pipeline clock cycle and a second pipeline clock cycle respectively; generate a first pipeline clock and a second pipeline clock having periods twice that of the first and second input clocks, wherein the first pipeline clock is high during the first pipeline clock cycles and the second pipeline clock is the inverse of the first pipeline clock; and generate a third pipeline clock and a fourth pipeline clock having periods twice that of the first and second input clocks, where the third pipeline clock is high during the second pipeline clock cycle and the fourth pipeline clock is the inverse of the third pipeline clock.

In some embodiments, a read operation initiated in any clock cycle may be paired with a write operation initiated in the same clock cycle, and the read operation and the write operation may be executed sequentially over two clock cycles, either to a same SRAM bank or to a different SRAM bank. The read operation may be executed for less than two cycles, the write operation may be executed for less than or equal to a duration of one cycle, and a combined duration of the read operation and the write operation may not exceed two cycles.

First Embodiments

FIG. 3 is an illustrative block diagram of an eight-bank dual-pipe Quad-B2 SRAM implementation. While eight banks are illustrated and discussed herein, those of ordinary skill in the art will appreciate that the disclosed innovations may be applied to memory circuits having other numbers of banks. The first address input pipeline AIPu 301 and the second address input pipeline AIPv 302 may be used to latch read and write addresses, de-multiplex them into separate U read, U write, V read, and V write addresses, time-multiplex the U read and U write addresses into a single U read/write address stream Au that may be bussed to each memory bank 321, and time-multiplex the V read and V write addresses into a single V read/write address stream Av that may be bussed to each memory bank 321. Inputs 380, e.g., clock/timing/control signals such as R#, W#, K and K# may be provided to the first address input pipeline. Similarly, inputs 390, e.g., clock/timing/control signals such as K, K#, KD and KD# may be provided to the second address input pipeline 302.

The first data input pipeline DIPu 302 and the second data input pipeline DIPv 303 may be used to latch the two beats of write data and de-multiplex them into separate U beat one, U beat two, V beat one, and V beat two write data streams D0u, D1u, D0v, and D1v that may be bussed to each memory bank 321.

At each memory bank, a 2:1 mux 311 may select which addresses in the Au and Av read/write address streams are used to read and/or write the bank 321.

At each memory bank, one 2:1 mux 312 may select which beat one write data from the D0u and D0v write data streams is used to write the bank 321, and a second 2:1 mux 312 may be used to select which beat two write data from the D1u and D1v write data streams is used to write the bank 321.

Two examples of the first implementation are described below. In each example, the read operation initiated in a first U cycle may be paired with a write operation initiated in a first U cycle (although not necessarily the same first U cycle), and the two operations may be executed sequentially over two cycles, either to the same memory bank or to different banks. In conjunction, the associated read and write addresses may propagate to each memory bank 321 through the first address input pipeline AIPu 301 and the 2:1 A Mux 321, and the associated write data may propagate to each memory bank 321 through the first data input pipeline DIPu 303 and a 2:1 D Mux 312.

The read operation initiated in a second V cycle may be paired with a write operation initiated in a second V cycle (although not necessarily the same second V cycle), and the two operations may be executed sequentially over two cycles, either to the same memory bank or to different banks. In conjunction, the read and write associated addresses may propagate to each memory bank 321 through the second address input pipeline AIPv 302 and the 2:1 A Mux 321, and the associated write data may propagate to each memory bank 321 through the second data input pipeline DIPv 304 and a 2:1 D Mux 312.

The AIPu/v and DIPu/v implementations may differ based on inclusion/exclusion of write buffering. The address and data multiplexing at each memory bank may be the same for both implementations.

Note that because pairs of read and write operations may be executed over two cycles, yet pairs of read and write operations may be initiated every cycle, one or two memory banks may be busy (i.e. in the midst of being accessed) when a new pair of read and write operations is initiated. The user may operate the memory to avoid "bank conflicts"—i.e. to avoid reading banks that are busy due to previous read and write operations.

Note also that, with aspects of the innovations herein, when a read and write operation initiated to the same bank are executed sequentially over two cycles, each operation may not necessarily be executed within one cycle. Rather, the read operation may be executed in greater than one cycle, and the write operation may be executed in less than one cycle, provided the combined duration of both operations is no greater than two cycles, for example. This concept is illustrated in FIG. 16, set forth further below.

Example 1

Address Input Aspects

A first example is described below of an implementation without write buffering for each of the address input and data input. With respect to the address input as illustrated in FIG. 4, six registers (or latches) 401, 402, 421, 422, 423, 424 and two muxes 441, 442 may be used to implement the first address input pipeline AIPu and second address input pipeline AIPv. As depicted in FIG. 4, the six registers may be divided into two groups of three, one group (401, 421, 422) for the read address path and one group (402, 423, 424) for the write address path.

The three registers in the read address path may be implemented in two stages. Stage one may include one register RA 401 that may use the rising edge of first clock K 62 to capture the read address every cycle, regardless of whether first read control R# 32 is captured "low" or "high" at that clock edge; consequently the captured address may be unused if a read operation is not initiated in the cycle. Stage two may include two registers RAu 421 and RAv 422. RAu 421 may use the rising edge of first pipeline clock Ku 66 to re-latch the read address from RA 401, thereby generating a U read address that may remain valid for two clock cycles. RAv 422 may use the rising edge of third pipeline clock Kv 72 to re-latch the read address from RA 401, thereby generating a V read address that may remain valid for two clock cycles.

The three registers in the write address path may be implemented in two stages. The stage one path may include one register WA 402 that may use the rising edge of second input clock K# 64 to capture the write address. In one embodiment, the rising edge of second input clock K# 64 may be used only in cycles in which first write control W 86 is captured "low" at the previous rising edge of first input clock K 62; consequently the captured write address may always be used, and power may be saved in those cycles in which write operations are not initiated. Stage two may include two registers WAu 423 and WAv 424. WAu 423 may use the rising edge of second pipeline clock Ku# 68 to re-latch the write address from WA 402, thereby generating a U write address that may remain valid for two clock cycles. WAv 424 may use the rising edge of fourth pipeline clock Kv# 74 to re-latch the write address from WA 402, thereby generating a V write address that may remain valid for two clock cycles.

The first mux Mu 441 may be used to time-multiplex the U read and write addresses into a single U read/write address stream AU that may be bussed to each memory bank 321. First pulse Ru 451 may be a one-shot pulse derived from first pipeline clock Ku 66 that may cause the U read address to be selected, and may be shorter than one cycle at slow operating frequency, or longer than one cycle at maximum operating frequency. Second pulse Wu 461 may be a one-shot pulse derived from Kv 72 when Ru 451 is shorter than one cycle, or self-timed from Ru 451 completed when Ru 451 is longer than one cycle, causing the U write address to be selected. In other words, Wu 461 may be a one-shot pulse derived from the logical function of "NOT(Ru) AND Kv". Like with the WA 402 register, one implementation may provide that Wu only goes active when a write operation is initiated in a U cycle (i.e. when W 86 is captured "low" at the rising edge of K 62 in a U cycle); consequently, Au may only change from a U read address to a U write address if a write operation is initiated, and power may be saved in those cycles in which a write operation is not initiated.

The second mux Mv 442 may be used to time-multiplex the V read and write addresses into a single V read/write address stream AV that may be bussed to each memory bank 321. Third pulse Rv 452 may be a one-shot pulse derived from third pipeline clock Kv 72 that may cause the V read address to be selected, and may be shorter than one cycle at slow operating frequency, or longer than one cycle at maximum operating frequency. Fourth pulse Wv 462 may be a one-shot pulse derived from Ku 66 when Rv 452 is shorter than one cycle, or self-timed from Rv 452 completed when Rv 452 is longer than one cycle, causing the V write address to be selected. In other words, Wv 462 may be a one-shot pulse derived from the logical function of "NOT(Rv) AND Ku". Like with the WA 402 register, one implementation may provide that Wv 462 only goes active when a write operation is initiated in a V cycle (i.e. when W 86 is captured "low" at the rising edge of K 62 in a V cycle); consequently, Av may only change from a V read address to a V write address if a write operation is initiated, and power may be saved in those cycles in which a write operation is not initiated.

In some implementations, registers RA 401, Rau 421, WA 402, WAu 423 and mux Mu 441 may comprise the AIPu 301, and registers RA 401, RAv 422, WA 402, WAv 424 and mux Mv 442 may comprise the AIPv 302.

In such implementations, the read initiated in any U cycle may be paired with the write initiated in the same U cycle. The read initiated in any V cycle may be paired with the write initiated in the same V cycle.

Note that in FIG. 4, write address pre-decode 412 is shown before the write address is captured by WAu 423 and WAv 424 (in which case one set of write address pre-decode logic is needed), whereas read address pre-decode 431, 432 is shown after the read address is captured by RAu 421 and RAv 422 (in which case two sets of read address pre-decode logic are needed). This particular depiction is for illustrative purposes only; in practice, the write address pre-decode and read address pre-decode may be done any time before Mu and Mv.

Data Input Aspects

In another implementation, eight registers (or latches) may be used to implement the DIPu and DIPv. As depicted in FIG. 5, the eight registers 501, 502, 511, 512, 521, 522, 523, 524 may be divided into two groups of four with one group (501, 511, 521, 522) for the beat one write data and one group (502, 512, 523, 524) for the beat two write data.

The four registers in the beat one write data path may be implemented in three stages. Stage one may include one register D0KD 501 that may use the rising edge of first data input clock KD 54 to capture the beat one write data every cycle, regardless of whether W# is captured "low" or "high" at the rising edge of first input clock K 62 in the same clock; consequently the captured data may be unused if a write operation is not initiated in the cycle.

Stage two may include one register D0K 511 that may use the rising edge of second input clock K# 64 to re-latch the beat one write data from D0KD 501, thereby transferring the data from the first data input clock KD 54 clock domain to the first input clock K 62 clock domain.

Stage three may include two registers D0Ku 521 and D0Kv 522. D0Ku 521 may use the rising edge of third pipeline clock Kv 72 to re-latch the beat one write data from D0KD 501, thereby generating a U beat one write data that may remain valid for two clock cycles. D0Kv 522 may use the rising edge of first pipeline clock Ku 66 to re-latch the beat one write data from D0K 511, thereby generating a V beat one write data that may remain valid for two clock cycles.

The four registers in the beat two write data path may be implemented in three stages. Stage one may include one register D1KD 502 that may use the rising edge of the first data input clock KD# 56 to capture the beat two write data every cycle, regardless of whether W# is captured "low" or "high" at the rising edge of first input clock K 62 in the same cycle; consequently the captured data may be unused if a write operation is not initiated in the cycle.

Stage two may include one register D1K 512 that may use the rising edge of the first input clock K 62 to re-latch the beat two write data from D1KD 502, thereby transferring the data from the first data input KD clock domain to the K clock domain.

Stage three may include two registers D1Ku 523 and D1Kv 524. D1Ku may use the rising edge of third pipeline clock Kv 72 to re-latch the beat two write data from D1K 512, thereby generating a U beat two write data that may remain valid for two clock cycles. D1Kv 524 may use the rising edge of first pipeline clock Ku 66 to re-latch the beat two write data from D1K 512, thereby generating a V beat two write data that may remain valid for two clock cycles.

Together, in some implementations, registers D0KD 501, D0K 511, D0Ku 521, D1KD 502, D1K 512, and D1Ku 523 may comprise the DIPu, and registers D0KD 501, D0K 511, D0Kv 522, D1KD 502, D1K 512, and D1Kv 524 may comprise the DIPv.

Note that the implementations of stages one and two in the write data paths may allow for the first data input clock KD 54 clock edges to lead or trail the corresponding K 62 clock edges by approximately a half cycle.

FIG. 6 depicts the signal timing associated with FIGS. 4 and 5 and/or any other circuit implementation capable of carrying out the functions described above with respect to FIGS. 4 and 5 for multiple cycles of K 62 (e.g., R1 and W1 are read and write functions, respectively, carried out during a first illustrated cycle of K 62, R2 and W2 are read and write functions, respectively, carried out during a second illustrated cycle of K 62, R3 and W3 are read and write functions, respectively, carried out during a third illustrated cycle of K 62, R4 and W4 are read and write functions, respectively, carried out during a fourth illustrated cycle of K 62, R5 and W5 are read and write functions, respectively, carried out during a fifth illustrated cycle of K 62, R6 and W6 are read and write functions, respectively, carried out during a sixth illustrated cycle of K 62, and R7 and W7 are read and write functions, respectively, carried out during a seventh illustrated cycle of K 62). The propagation of write data (D10-D71) through the system elements 501-524 as described above may be observed as a function of timing in FIG. 6.

Note that in this example, each new read operation (in one pipe) overlaps with both the read and the write operations from the previous cycle (in the other pipe), as illustrated by the overlapping Au 441 and Av 442 addresses in FIG. 6. Consequently, when a read operation is initiated in cycle "n", it must be to a different bank than the one read in cycle "n−1" and the one written in cycle "n−1". These may be the only bank conflict restrictions in this particular implementation, unless other bank conflict restrictions are specified by a user or application, for example.

Example 2

Another implementation is provided below with write buffering features. Write buffering may be facilitated by inserting additional register (or latch) stages (referred to as "write buffers") in the write address and write data paths such that write operations are executed some number of cycles after they are initiated, for example.

Address Input Aspects

Any number of write buffers greater than or equal to one may be inserted in the first address input pipeline AIPu and second address input pipeline AIPv after the write address is split into the U and V pipelines.

FIG. 7 illustrates "n" stages of additional registers inserted in the first address input pipeline AIPu and second address input pipeline AIPv after the write address is split into the U and V pipelines (compared to FIG. 4). Specifically, WAB1u 723 and WAB1v 724 represent the first stage of additional registers, and WABnu 725 and WABnv 726 represent the nth stage of additional registers.

FIG. 8 shows one implementation of two-stage write buffering where two additional registers are inserted in the first address input pipeline AIPu and second address input pipeline AIPv after the write address is split into the U and V pipelines. Consequently, a total of ten registers (801, 802, and 821-828) and two muxes (841 and 842) may be used to implement the first address input pipeline AIPu and second address input pipeline AIPv in this example.

As illustrated in FIG. 8, the ten registers may be divided into a group of three (801, 821, 822) and a group of seven (802 and 823-828); the group of three may be used for the read address path, and the group of seven may be used for the write address path.

In one implementation, the three registers in the read address path may be implemented in two stages, similar to FIG. 4.

In some implementations, the seven registers in the write address path may be implemented in four stages. Stage one may include one register WA 802 similar to WA 402 in FIG. 4.

Stage two may include two registers WAB1u 823 and WAB1v 824. WAB1u 823 may be the first "write buffer" inserted in the write address path of the AIPu. WAB1u 823 may use the rising edge of third pipeline clock Kv 72 to re-latch the write address from WA 802, thereby generating a U write address that may remain valid for two clock cycles. WAB1v 824 may be the first "write buffer" inserted in the write address path of the AIPv. WAB1v 824 may use the rising edge of the first pipeline clock Ku 66 to re-latch the write address from WA 802, thereby generating a V write address that may remain valid for two clock cycles.

Stage three may include two registers WAB2u 825 and WAB2v 826. WAB2u 825 may be the second "write buffer" inserted in the write address path of the address input pipeline AIPu. WAB2u 825 may use the rising edge of third pipeline clock Kv 72 to re-latch the write address from WA 802, thereby generating a U write address that may remain valid for two clock cycles. WAB2v 826 is the second "write buffer" inserted in the write address path of the AIPv. WAB2v 826 may use the rising edge of the first pipeline clock Ku 66 to re-latch the write address, thereby generating a V write address that may remain valid for two clock cycles.

Stage four may include two registers WAu 827, and WAv 828. WAu 827 may be the last register in the write address path of the address input pipeline AIPu. WAu 827 may be functionally equivalent to WAu 423 in FIG. 4, except WAu 827 may use the rising edge of Ku 66 (rather than Ku# 68) to re-latch the write address from WAB2u 825, thereby generating a U write address that may remain valid for two clock cycles. WAv 828 may be the last register in the write address path of the AIPv. WAv 828 may be functionally equivalent to WAv 424 in FIG. 4, except WAv 828 may use the rising edge of Kv 72 (rather than Kv# 74) to re-latch the write address from WAB2v 826, thereby generating a V write address that may remain valid for two clock cycles.

The two muxes Mu 841 and Mv 842 may be functionally identical to Mu 441 and Mv 442 in FIG. 4.

Together, registers RA 801, Rau 821, WA 802, WAB1u 823, WAB2u 825, WAu 827 and mux Mu 841 may comprise the AIPu, and registers RA 801, RAv 822, WA 802, WAB1v 824, WAB2v 826, WAv 828 and mux Mv 842 may comprise the AIPv.

In this implementation, the read initiated in any U cycle may be paired with the write initiated in the U cycle from four cycles previously. The read initiated in any V cycle may be paired with the write initiated in the V cycle from four cycles previously.

Note that in FIG. 8, write address pre-decode 812 is shown before the write address is captured by WAB1u and WAB1v (in which case one set of write address pre-decode logic is needed), whereas read address pre-decode 831, 832 is shown after the read address is captured by RAu 821 and RAv 822 (in which case two sets of read address pre-decode logic are needed). This particular depiction is for illustrative purposes only; in practice, the write address pre-decode and read address pre-decode may be done any time before Mu and Mv.

Data Input Aspects

Any number of write buffers greater than or equal to one may be inserted in the DIPu and DIPv after the two beats of write data are split into the U and V pipelines, but the number inserted must be the same as the number inserted in the AIPu and AIPv so that write data remains aligned with its associated write address.

Such features are illustrated by way of example in FIG. 9, where "n" stages of additional registers are inserted in the DIPu and DIPv after the two beats of write data are split into the U and V pipelines (compared to FIG. 5). Specifically, D0B1u 921, D0B1v 922, D1B1u 923, and D1B1v 924 represent the first stage of additional registers, and D0Bnu 931, D0Bnv 932, D1Bnu 933, and D1Bnv 934 represent the nth stage of additional registers.

FIG. 10 shows an example of two-stage write buffering where two additional registers are inserted in the DIPu and DIPv after the beat one write data is split into the U and V pipelines, and two additional registers are inserted in the DIPu and DIPv after the beat two write data is split into the U and V pipelines, thereby matching the two-stage write buffering of the write address illustrated in FIG. 8. Additionally, the initial portion of the DIPu and DIPv (prior to when the beat one and beat two write data is split into the U and V pipelines) has been expanded from four to nine registers/latches, to illustrate an alternate latch-based implementation of this portion. Consequently, a total of twenty-one registers/latches are used to implement the DIPu and DIPv in this example.

As depicted in FIG. 10, the twenty-one registers/latches may be divided into a group of eleven (1001, 1003, 1011, 1013, 1015, 1021, 1022, 1031, 1032, 1041, 1042) and a group of ten (1002, 1004, 1014, 1016, 1023, 1024, 1033, 1034, 1043, 1044); the group of eleven may be used for the beat one write data path, and the group of ten may be used for the beat two write data path.

According to one illustrative implementation, for example, the eleven registers in the beat one write data path may be implemented in eight stages.

Stage one may include one register D0KDa 1001 similar to D0KD 501 in FIG. 5. D0KDa 1001 may use the rising edge of first data input clock KD 54 to capture the beat one write data every cycle, regardless of whether W# is captured "low" or "high" at the rising edge of the first input clock K 62 in the same clock; consequently the captured data may be unused if a write operation is not initiated in the cycle.

Stage two may include one latch D0KDb 1003. D0KDb 1003 may use the second data input clock KD# 56 to re-latch the beat one write data from D0KDa 1001. The latch may be transparent while KD# 56 is "low", and may latch when KD# 56 goes "high".

Stage three may include one latch D0Ka 1011 that may use K# 64 to re-latch the beat one write data from D0KDb 1003, thereby transferring the data from the first data input clock KD 54 clock domain to the input clock K 62 clock domain. The latch may be transparent while K# 64 is "low", and may latch when K# 64 goes "high".

Stage four may include one latch D0Kb 1013. D0Kb may use K 62 to re-latch the beat one write data from D0Ka 1011. The latch may be transparent while K 62 is "low", and may latch when K 62 goes "high".

Stage five may include one latch D0Kc 1015 that may use K# 64 to re-latch the beat one write data from D0Kb 1013. The latch may be transparent while K# 64 is "low", and may latch when K# 64 goes "high".

Stage six may include two registers D0B1u 1021 and D0B1v 1022. D0B1u 1021 may be the first "write buffer" inserted in the beat one write data path of the DIPu. D0B1u 1021 may use the rising edge of fourth pipeline clock Kv#74 to re-latch the beat one write data from D0Kc 1015, thereby generating a U beat one write data that may remain valid for two clock cycles. D0B1v 1022 may be the first "write buffer" inserted in the beat one write data path of the DIPv. D0B1V 1022 may use the rising edge of the second pipeline clock Ku# 68 to re-latch the beat one write data from D0Kc 1015, thereby generating a V beat one write data that may remain valid for two clock cycles.

Stage seven may include two registers D0B2u 1031 and D0B2v 1032. D0B2u 1031 may be the second "write buffer" inserted in the beat one write data path of the DIPu. D0B2u 1031 may use the rising edge of the third pipeline clock Kv 72 to re-latch the beat one write data from D0B1u 1021, thereby generating a U beat one write data that may remain valid for two clock cycles. D0B2v 1032 may be the second "write buffer" inserted in the beat one write data path of the DIPv. D0B2v 1032 may use the rising edge of first pipeline clock Ku to re-latch the beat one write data from D0B1v 1022, thereby generating a V beat one write data that may remain valid for two clock cycles.

Stage eight may include two registers D0Ku 1041 and D0Kv 1042. D0Ku 1041 may be the last register in the beat one write data path of the DIPu. D0Ku 1041 may be functionally equivalent to D0Ku 521 in FIG. 5, except it may use the rising edge of the first pipeline clock Ku 66 (rather than Kv 72) to re-latch the beat one write data from D0B2u 1031, thereby generating a U beat one write data that may remain valid for two clock cycles. D0Kv 1042 may be the last register in the beat one write data path of the DIPv. D0Kv 1042 may be functionally equivalent to D0Kv 522 in FIG. 5, except it may use the rising edge of third pipeline clock Kv 72 (rather than Ku 66) to re-latch the beat one write data from D0B2v 1032, thereby generating a V beat one write data that may remain valid for two clock cycles.

The ten registers in the beat two write data path may be implemented in seven stages. Stage one may include one register D1KDa 1002 that may be similar to D1KD 502 in FIG. 5. D0KDa 1002 may use the rising edge of second data input clock KD# 56 to capture the beat two write data every cycle, regardless of whether W# is captured "low" or "high" at the rising edge of first input clock K 62 in the same clock;

consequently the captured data may be unused if a write operation is not initiated in the cycle.

Stage two may include one latch D1KDb 1004 that may use first data input clock KD 54 to re-latch the beat two write data from D1KDa 1002. The latch may be transparent while KD 54 is "low", and may latch when KD 54 goes "high".

Stage three may include one latch D1Kb 1014 that may use first input clock K 62 to re-latch the beat two write data from D1KDb 1004, thereby transferring the data from the KD 54 clock domain to the K 62 clock domain. The latch may be transparent while K 62 is "low", and may latch when K 62 goes "high".

Stage four may include one latch D1Kc 1016 that may use second input clock K# 64 to re-latch the beat two write data from D1Kb 1014. The latch may be transparent while K# 64 is "low", and may latch when K# 64 goes "high".

Stage five may include two registers D1B1u 1023 and D1B1v 1024. D1B1u 1023 may be the first "write buffer" inserted in the beat two write data path of the DIPu. D1B1u 1023 may use the rising edge of fourth pipeline clock Kv#74 to re-latch the beat two write data from D1Kc 1016, thereby generating a U beat two write data that may remain valid for two clock cycles. D1B1v 1024 may be the first "write buffer" inserted in the beat two write data path of the DIPv. D1B1v 1024 may use the rising edge of second pipeline clock Ku# 68 to re-latch the beat two write data from D1Kc 1016, thereby generating a V beat two write data that may remain valid for two clock cycles.

Stage six may include two registers D1B2u 1033 and D1B2v 1034. D1B2u 1033 may be the second "write buffer" inserted in the beat two write data path of the DIPu. D1B2u 1033 may use the rising edge of third pipeline clock Kv 72 to re-latch the beat two write data from D1B1u 1023, thereby generating a U beat two write data that may remain valid for two clock cycles. D1B2v 1034 may be the second "write buffer" inserted in the beat two write data path of the DIPv. D1B2v 1034 may use the rising edge of first pipeline clock Ku 66 to re-latch the beat two write data from D1B1v 1024, thereby generating a V beat two write data that may remain valid for two clock cycles.

Stage seven may include two registers D1Ku 1043 and D1Kv 1044, where D1Ku 1043 may be the last register in the beat two write data path of the DIPu. D1ku 1043 may be functionally equivalent to D1Ku 523 in FIG. 5, except it may use the rising edge of first pipeline clock Ku 66 (rather than Kv 72) to re-latch the beat two write data from D1B2u 1033, thereby generating a U beat two write data that may remain valid for two clock cycles. D1Kv 1044 may be the last register in the beat two write data path of the DIPv. D1kv 1044 may be functionally equivalent to D1Kv 524 in FIG. 5, except it may use the rising edge of third pipeline clock Kv 72 (rather than Ku 66) to re-latch the beat two write data from D1B2v 1034, thereby generating a V beat two write data that may remain valid for two clock cycles.

Together, registers D0KDa 1001, D0KDb 1003, D0Ka 1011, D0Kb 1013, D0Kc 1015, D0B1u 1021, D0B2u 1031, D0Ku 1041, D1KDa 1002, D1KDb 1004, D1Kb 1014, D1Kc 1016, D1B1u 1023, D1B2u 1033, and D1Ku 1043 may comprise the D1Pu, and registers D0KDa 1001, D0KDb 1003, D0Ka 1011, D0Kb 1011, D0Kc 1015, D0B1v 1022, D0B2v 1032, D0Kv 1042, D1KDa 1002, D1KDb 1004, D1 Kb 1014, D1Kc 1016, D1B1v 1024, D1B2v 1034, and D1Kv 1044 may comprise the DIPv.

Note that the implementations of stages one through five in the beat one write data path, and stages one through four in the beat two write data path, may allow for the KD 54 clock edges to lead or trail the corresponding K 62 clock edges by approximately half a cycle.

FIG. 11 depicts the signal timing associated with FIGS. 8 and 10 and/or any other circuit implementation capable of carrying out the functions described above with respect to FIGS. 8 and 10.

Note that in this example, each new read operation (in one pipe) overlaps with the read operation from the previous cycle (in the other pipe), and with the write operation from 5 cycles previously (in the other pipe), as illustrated by the overlapping Au 841 and Av 842 addresses in FIG. 11. Consequently, when a read operation is initiated in cycle "n", it must be to a different bank than the one read in cycle "n−1" and the one written in cycle "n−5". These would be the only bank conflict restrictions in this particular implementation, unless other bank conflict restrictions are specified by a user or application, for example.

Multiplexing Read and Write Addresses to Each Memory Bank

As illustrated in FIG. 3, the Au and Av read and write addresses generated by the AIPu 301 and AIPv 302 respectively may be time-multiplexed to each memory bank 321. Bank Addresses BA—i.e. address bits that indicate which memory bank is being read or written—may comprise a portion of the read and write address fields and may be used to control the muxing of the non-bank address bits MA to each bank 321.

FIG. 12 illustrates the muxing of the Au and Av read and write addresses to the target memory bank 321. Au(MA) 1201 may be the non-bank address bits from the Au read and write addresses output by the AIPu 301 and may be inputs to each bank's A Mux. Av(MA) 1202 may be the non-bank address bits from the Av read and write addresses output by the AIPv and may be inputs to each bank's A Mux. An Mux 1231 may be the read and write address input mux that muxes Au(MA) 1201 and Av(MA) 1202 to bank "n". MA(n) 1221 may be the output of the An Mux 1231 that provides read and write addresses to bank "n". Au(BAn) 1211 may be decoded from the bank address bits from the Au read and write addresses that indicate bank "n" is to be read or written. When active, MA(n) 1221=Au(MA) 1201, for example. Av(BAn) 1212 may be decoded from the bank address bits from the Av read and write addresses that may indicate bank "n" is to be read or written. When active, MA(n) 1221=Av(MA) 1202.

The address muxes depicted in FIGS. 4, 8, and 12 may be implemented as illustrated in FIG. 13 in some embodiments. A 42 and B 48 may be the two inputs to the address mux 1301, and Y may be the output of the mux 1301. AS 1342 and BS 1348 may be the two "select" signals that control whether Y=A, Y=B, or Y=0. Addr Mux 1301 may be the logical representation of the address mux. In some implementations, the address mux 1301 may comprise three drivers DRA 1311, DRB 1312, and DRX 1313. The output of DRA=A when AS 1342 is active, and is tri-stated when AS 1342 is inactive. The output of DRB=B when BS 1348 is active, and is tri-stated when BS 1348 is inactive. The output of DRX=0 when AS 1342 and BS 1348 are both inactive, and is tri-stated otherwise. Those of ordinary skill in the art will appreciate that this is one example of a mux that could be used as address mux 1301, but any mux exhibiting the above-described features may be used as the address mux 1301.

Multiplexing Write Data to Each Memory Bank

As illustrated in FIG. 3, the D0u/D1u and D0v/D1v write data generated by the DIPu 303 and DIPv 304 respectively may be time-multiplexed to each memory bank 321. The same bank addresses that control the muxing of addresses to each bank 321 may be used to control the muxing of the write data to each bank 321.

FIG. 14 illustrates the muxing of the D0u 1401 and D0v 1402 write data and the D1u 1403 and D1v 1404 write data to the target memory bank 321 according to some embodiments. D0u 1401 may be the beat one write data output by the DIPu 303 and may be an input to each bank's D0n Mux. D0v 1402 may be the beat one write data output by the DIPv 304 and may be an input to each bank's D0n Mux.

D1u 1403 may be the beat two write data output by the DIPu 303 and may be an input to each bank's D1n Mux. D1v 1404 may be the beat two write data output by the DIPv 304 and may be an input to each bank's D1n Mux. D0n Mux 1431 may be the write data input mux that muxes D0u and D0v to bank "n". D1n Mux 1432 may be the write data input mux that muxes D1u and D1v to bank "n". D0(n) 1421 may be the output of the D0n Mux that provides beat one write data to bank "n". D1(n) 1422 may be the output of the D1n Mux that provides beat two write data to bank "n".

Au(BAn).WP 1411 may be a one-shot pulse generated from the decoded bank address bits from the Au write address that indicate bank "n" is to be written. When active, D0(n)=D0u and D1(n)=D1u. Av(BAn).WP 1412 may be a one-shot pulse generated from the decoded bank address bits from the Av write address that indicate bank "n" is to be written. When active, D0(n)=D0v and D1(n)=D1v.

The data muxes depicted in FIG. 14 may be implemented as illustrated in FIG. 15. A 42 and B 48 may be the two inputs to the mux, and Y may be the output of the mux. AS 1342 and BS 1348 may be the two "select" signals that control whether Y=A or Y=B. Data Mux 1501 may be the logical representation of the data mux. In some implementations, Data Mux 1501 may comprise two drivers DRA 1511 and DRB 1512, and a latch 1513. The output of DRA=A when AS 1342 is active, and is tri-stated when AS 1342 is inactive. The output of DRB=B when BS 1348 is active, and is tri-stated when BS 1348 is inactive. The latch may be used to keep Y at its current state after both AS 1342 and BS 1348 are inactivated. Those of ordinary skill in the art will appreciate that this is one example of a mux that could be used as data mux 1501, but any mux exhibiting the above-described features may be used as the data mux 1501.

FIGS. 16-17 depict the signal timing associated with FIGS. 12-15 and/or any other circuit implementation capable of carrying out the functions described above with respect to FIGS. 12-15. An "(n)" listed in an Au or Av address field indicates that bank "n" is the target bank for that particular operation.

Note that when operating at maximum frequency (as illustrated in FIG. 16), the read operation, as evident from the width of MA(n) when it contains a read address, may be greater than one cycle in duration, and the write operation, as evident from the width of MA(n) when it contains a write address, may be less than one cycle in duration.

Second Embodiments

Some implementations of the present invention herein describe systems and methods for capturing pairs of read and write addresses, and propagating them to each memory bank through two distinct address input pipelines, each of which operates at half of the external clock frequency of the SRAM. The read and write control signals are captured and propagated to each memory bank. Two beats of write data are captured and transferred per write operation, and are propagated to each memory bank through two distinct data input pipelines, each of which operates at half of the external clock frequency of the SRAM. Details on different implementations are provided below.

At each memory bank, the bank address portion of the read and write addresses from the two address input pipelines are used to determine if the associated read and/or write operation(s) are targeted for that particular bank.

At each memory bank, the non-bank address portion of the read and write addresses from the two address input pipelines are used to select the particular location(s) within the bank to be read and/or written, if the associated read and/or write operation(s) are targeted for that particular bank (as determined by the bank address portion of the read and write addresses).

At each memory bank, the appropriate two beats of write data from the two data input pipelines are selected to be stored in the particular location within the bank (as determined by the non-bank address portion of the write addresses), if the associated write operation is targeted for that particular bank (as determined by the bank address portion of the write addresses).

FIG. 19 is an illustrative block diagram of an eight-bank dual-pipe Quad-B2 SRAM implementation. The Address Input Latch/Mux AILM 1901 latches read and write addresses and time-multiplexes them into a single read/write address stream Ain that is bussed to each memory bank 1921. The Control Input Latch CIL 1902 latches read and write control signals Rin, Win that are subsequently bussed to each memory bank 1921. The Data Input Latch/Mux DILM 1903 latches the two beats of write data and time-multiplexes them into a single write data stream Din that is bussed to each memory bank 1921.

At each memory bank, the Ain read/write address stream is de-multiplexed 1911 into separate U read, U write, V read, and V write addresses that are validated by the Rin and Win control signals. A 4:1 mux 1912 is used to select which of those addresses are used to read and/or write the bank.

At each memory bank, the Din write data stream is de-multiplexed 1913 into separate U beat one, U beat two, V beat one, and V beat two write data, one 2:1 mux 1914 selects which beat one write data is used to write the bank, and a second 2:1 mux 1914 selects which beat two write data is used to write the bank.

In this manner, the read operation initiated in a U cycle is paired with the write operation initiated in the same U cycle, and the two operations are executed sequentially over two cycles, either to the same memory bank or to different banks. In conjunction, the associated read and write addresses propagate to each memory bank 1921 through the AILM 1901, the U portion of the 1:4 A U/V De-mux 1911, and the 4:1 A Mux 1912, the associated read and write control signals propagate to each memory bank 1921 through the CIL 1902, and the associated write data propagates to each memory bank 1921 through the DILM 1902, the U portion of the 1:4 D U/V De-mux 1913, and a 2:1 D Mux 1914.

The read operation initiated in a V cycle is paired with the write operation initiated in the same V cycle, and the two operations are executed sequentially over two cycles, either to the same memory bank or to different banks. In conjunction, the associated read and write addresses propagate to each memory bank 1921 through the AILM 1901, the V portion of the 1:4 A U/V De-mux 1911, and the 4:1 A Mux 1912, the associated read and write control signals propagate to each memory bank 1921 through the CIL 1902, and the associated write data propagates to each memory bank 1921 through the DILM 1902, the V portion of the 1:4 D U/V De-mux 1913, and a 2:1 D Mux 1914.

Note that because pairs of read and write operations are executed over two cycles, yet pairs of read and write operations can be initiated every cycle, one or two memory banks may be busy (i.e. in the midst of being accessed) when a new pair of read and write operations is initiated. It is up to the user to avoid "bank conflicts"—i.e. to avoid reading banks that are busy due to previous read and write operations.

Note also that with the inventions herein, when a read and write operation initiated to the same bank are executed sequentially over two cycles, each operation isn't necessarily executed within one cycle. Rather, the read operation can be executed in greater than one cycle, and the write operation can be executed in less than one cycle, provided the combined duration of both operations is no greater than two cycles. This concept is illustrated in FIG. 29 and discussed in detail below.

Address & Control Input

FIG. 20 is a block diagram depicting illustrative address input circuitry, consistent with one or more aspects of the innovations herein. FIG. 4 illustrates an AILM including two registers (or latches) and a mux. For example, Register RA 2001 uses the rising edge of K to capture the read address every cycle, regardless whether the first read control R# is captured "low" or "high" at that clock edge; consequently the captured address is unused if a read operation is not initiated in the cycle. Register WA 2002 uses the rising edge of K# to capture the write address. One implementation is to use the rising edge of K# only in cycles in which first write control W# is captured "low" at the previous rising edge of K; consequently the captured write address is always used, and power is saved in those cycles in which write operations are not initiated.

Mux AM 2011 time-multiplexes the captured read and write addresses into a single read/write address stream Ain that is bussed to each memory bank. K clock "high" causes the read address to be selected (i.e. muxed into the Ain address stream), and K# clock "high" causes write address to be selected (i.e. multiplexed into the Ain address stream). Like with the WA 2002 register, one implementation is to use the rising edge of K# only in cycles in which the first write control W# is captured "low" at the previous rising edge of K; consequently Ain only changes from a read address to a write address if a write operation is initiated, and power is saved in those cycles in which a write operation is not initiated.

FIG. 21 is a block diagram depicting illustrative control input latch circuitry, consistent with one or more aspects of the innovations herein. As illustrated in FIG. 21, the CIL may include three registers (or latches) and two inverters. Register RD 2101 uses the rising edge of K to capture the (active-low) read control signal every cycle, and its output is inverted 2111 to create an active-high Rin signal. Register WR 2102 uses the rising edge of K to capture the (active-low) write control signal every cycle, register WR1 2112 uses the rising edge of K# to re-latch the write control signal from WR every cycle, and its output is inverted 2122 to create an active-high Win signal.

FIG. 22 is a block diagram depicting illustrative de-multiplexer, consistent with one or more aspects of the innovations herein. At each memory bank in FIG. 22, the bank addresses in the Ain read/write address stream are decoded by Pre-Decoder 2201 to generate a single bit output bank (n), which is active if the bank addresses indicate that the corresponding read or write operation is targeted for that particular bank.

Six AND gates and six registers (or latches) are used to de-multiplex the bank (n) signal four ways, into separate U read, U write, V read, and V write bank (n) signals representing the 1:4 A U/V De-mux 1911 of the bank addresses, and those four bank (n) signals are used to generate one U read, two U write, one V read, and two V write bank (n) clocks. Bank (n) is logically ANDed with Rin via AND gate 2211 to generate rbank (n), to ensure it is generated from a valid read address when it is subsequently latched by RBAnu or RBAnv.

Bank (n) is logically ANDed with Win via AND gate 2212 to generate wbank (n), to ensure it is generated from a valid write address when it is subsequently latched by WBAnu or WBAnv.

Exemplary configuration and control of the various registers (or latches) may be as follows, for this illustrative implementation. For example, register RBAnu 2221 may use the rising edge of the first pipeline clock Ku to capture rbank (n), thereby generating a U read bank (n) signal RBAu(n) that is active for two cycles. RBAu(n) is logically ANDed with a delayed version of Ku via AND gate 2231, thereby generating a U read bank (n) clock KRu(n). Register RBAnv 2222 may use the rising edge of the third pipeline clock Kv to capture rbank (n), thereby generating a V read bank (n) signal RBAv(n) that is active for two cycles. RBAv(n) is logically ANDed with a delayed version of Kv via AND gate 2232, thereby generating a V read bank (n) clock KRv(n). Register WBAnu 2223 may use the rising edge of the second pipeline clock Ku# to capture wbank (n), thereby generating a U write bank (n) signal WBAu(n) that is active for two cycles. WBAu(n) is logically ANDed with a delayed version of Ku# via AND gate 2233 to generate a first U write bank (n) clock KWu(n). Register WBA1nu 2243 may use the rising edge of the third pipeline clock Kv to re-latch KWu(n), thereby generating a second U write bank (n) clock KW1u(n). Register WBAnv 2224 may use the rising edge of the fourth pipeline clock Kv# to capture wbank (n), thereby generating a V write bank (n) signal WBAv(n) that is active for two cycles. WBAv(n) is logically ANDed with a delayed version of Kv# via AND gate 2234 to generate a first V write bank (n) clock KWv(n). Register WBA1nv 2244 may use the rising edge of the first pipeline clock Ku to re-latch KWv(n), thereby generating a second V write bank (n) clock KW1v(n).

FIG. 23 is a block diagram depicting illustrative read/write circuitry, consistent with one or more aspects of the innovations herein. At each memory bank in FIG. 23, U read, U write, V read, and V write bank (n) pulses are generated from four of the clocks generated in FIG. 22.

Read U Self-Timed logic 2301 uses KRu(n) to generate a U read bank (n) pulse Ru(n) that is active for less than two cycles but not necessarily less than or equal to one cycle, which ultimately causes a read operation to bank (n) to occur.

Read V Self-Timed logic 2302 uses KRv(n) to generate a V read bank (n) pulse Rv(n) that is active for less than two cycles but not necessarily less than or equal to one cycle, which ultimately causes a read operation to bank (n) to occur.

Write U Self-Timed logic 2311 uses KW1u(n), along with Ru(n) and Wv(n) (to ensure that Wu(n) pulse begins after Ru(n) pulse or Wv(n) pulse ends), to generate a U write bank (n) pulse Wu(n) that is active for less than or equal to one cycle, which ultimately causes a write operation to bank (n) to occur. In other words, Wu(n) is a self-timed pulse derived from the logical function of "NOT(Ru(n)) AND NOT(Wv(n)) AND KW1u(n)".

Write V Self-Timed logic 2312 uses KW1v(n), along with Rv(n) and Wu(n) (to ensure that Wv(n) pulse begins after Rv(n) pulse or Wu(n) pulse ends), to generate a V write bank (n) pulse Wv(n) that is active for less than or equal to one cycle, which ultimately causes a write operation to bank (n) to occur. In other words, Wv(n) is a self-timed pulse derived from the logical function of "NOT(Rv(n)) AND NOT(Wu(n)) AND KW1v(n)".

The combined duration of Ru(n) active and Wu(n) active is less than or equal to two cycles. The combined duration of Rv(n) active and Wv(n) active is less than or equal to two cycles.

FIG. 24 is a block diagram depicting illustrative address multiplexer, consistent with one or more aspects of the innovations herein. At each memory bank in FIG. 24, the non-bank addresses in the Ain read/write address steam are decoded by Pre-Decoder 2401, four registers de-multiplex the decoded non-bank addresses four ways into separate bank (n) U read, U write, V read, and V write addresses (representing the 1:4 A U/V De-mux 1911 of the non-bank addresses), and a 4:1 mux (representing the 4:1 A Mux 1912) selects which of those addresses are used to read and/or write the particular bank.

Register RAnu (2411) uses the rising edge of KRu(n) (see FIG. 22) to capture the decoded non-bank addresses, thereby generating bank (n) U read addresses RAu(n) that remain valid for at least two cycles. Register WAnu (2412) uses the rising edge of KWu(n) (see FIG. 22) to capture the decoded non-bank addresses, thereby generating bank (n) U write addresses WAu(n) that remain valid for at least two cycles.

Register RAnv (2413) uses the rising edge of KRv(n) (see FIG. 22) to capture the decoded non-bank addresses, thereby generating bank (n) V read addresses RAv(n) that remain valid for at least two cycles. Register WAnv (2414) uses the rising edge of KWv(n) (see FIG. 22) to capture the decoded non-bank addresses, thereby generating bank (n) V write addresses WAv(n) that remain valid for at least two cycles.

A Mux 2421 selects which of those bank (n) addresses, RAu(n) and/or WAu(n), or RAv(n) and/or WAv(n), are used to read and/or write to that particular memory bank. Ru(n) causes RAu(n) to be selected, Wu(n) causes WAu(n) to be selected, Rv(n) causes RAv(n) to be selected, and Wv(n) causes WAv(n) to be selected.

FIG. 25 is a block diagram depicting illustrative address multiplexer, consistent with one or more aspects of the innovations herein. The address mux depicted in FIG. 24 is implemented as illustrated in FIG. 25. Inputs A, B, C, and D are the four inputs to the Address Mux 2501, and Y is the output of the mux 2501. Signals AS, BS, CS, and DS are the four "select" signals that control whether Y=A, Y=B, Y=C, Y=D, or Y=0. Addr Mux 2501 is the logical representation of the address mux. In one implementation, Mux 2501 comprises five drivers DRA 2511, DRB 2512, DRC 2513, DRD 2514, and DRX 2515.

The output of DRA is A when AS is active, and is tri-stated when AS is inactive. The output of DRB is B when BS is active, and is tri-stated when BS is inactive. The output of DRC is C when CS is active, and is tri-stated when CS is inactive. The output of DRD is D when DS is active, and is tri-stated when DS is inactive. The output of DRX is 0 when AS, BS, CS, and DS are all inactive, and is tri-stated otherwise.

Data Input

FIG. 26 is a block diagram depicting illustrative data input circuitry, consistent with one or more aspects of the innovations herein. FIG. 26 illustrates a DILM including four registers (or latches) and a mux. Register D0KD 2601 uses the rising edge of KD to capture the beat one write data every cycle, regardless whether first write control W# is captured "low" or "high" at the rising edge of K in the same clock; consequently the captured data is unused if a write operation is not initiated in the cycle. Register D1KD 2602 uses the rising edge of KD# to capture the beat two write data every cycle, regardless whether first write control W# is captured "low" or "high" at the rising edge of K in the same cycle; consequently the captured data is unused if a write operation is not initiated in the cycle. Register D0K 2611 uses the rising edge of K# to re-latch the beat one write data from D0KD, thereby transferring the data from the KD clock domain to the K clock domain. Register D1K 2612 uses the rising edge of K to re-latch the beat two write data from D1KD, thereby transferring the data from the KD clock domain to the K clock domain.

Mux DM 2621 time-multiplexes the captured beat one and beat two write data into a single write data stream Din that is bussed to each memory bank. K# clock "high" causes the beat one write data to be selected (i.e. muxed into the Din write data stream), and K clock "high" causes beat two write data to be selected (i.e. muxed into the Din write data stream). Like with Mux AM 2011 in FIG. 20, one implementation is to use K# and K only in cycles in which W# is captured "low" at the previous rising edge of K; consequently Din only changes to a new set of beat one and beat two write data if a write operation is initiated, and power is saved in those cycles in which a write operation is not initiated.

Note that the implementations of stages one and two in the write data paths allow for the KD clock edges to lead or trail the corresponding K clock edges by approximately a half cycle.

FIG. 27 is a block diagram depicting illustrative data multiplexer, consistent with one or more aspects of the innovations herein. At each memory bank in FIG. 27, six registers are used to de-multiplex the Din write data stream four ways, into separate bank (n) U beat one, U beat two, V beat one, and V beat two write data (representing the 1:4 D U/V De-mux 1913), and two 2:1 muxes (representing the 2 2:1 D Mux 1914) are used to select which of those two beats of write data are used to write the particular bank.

Register D0nua 2701 uses the rising edge of KWu(n) (see FIG. 22) to capture the beat one write data, and register D0nu 2711 uses the rising edge of KW1u(n) (see FIG. 22) to re-latch the beat one write data from D0nua, thereby generating bank (n) U beat one write data D0u(n). Register D0nva 2702 uses the rising edge of KWv(n) (see FIG. 22) to capture the beat one write data, and register D0nv 2712 uses the rising edge of KW1v(n) (see FIG. 22) to re-latch the beat one write data from D0nva, thereby generating bank (n) V beat one write data D0v(n). Register D1nu 2713 uses the rising edge of KW1u(n) (see FIG. 22) to capture the beat two write data, thereby generating bank (n) U beat two write data D1u(n). Register D1nv 2714 uses the rising edge of KW1v(n) (see FIG. 22) to capture the beat two write data, thereby generating bank (n) V beat two write data D1v(n).

D0n Mux 2721 selects which of those bank (n) beat one write data, D0u(n) or D0v(n), is used to write the particular memory bank. Wu(n) causes D0u(n) to be selected, and Wv(n) causes D0v(n) to be selected. D1n Mux 2722 selects which of those bank (n) beat two write data, D1u(n) or D1y(n), is used to write the particular memory bank. Wu(n) causes D1u(n) to be selected, and Wv(n) causes D1v(n) to be selected.

FIG. 28 is a block diagram depicting illustrative data multiplexer, consistent with one or more aspects of the innovations herein. The data muxes depicted in FIGS. 26 and 27, as well as Mux AM 2011 in FIG. 20, may be implemented as illustrated in FIG. 28.

A and B are two inputs to the mux 2801, and Y is the output of the mux 2801. AS and BS are the two select signals that control whether Y is A or Y is B. Data Mux 2801 is the logical representation of the data mux. In some implementations, Data Mux 2801 comprises two drivers DRA 2811 and DRB 2812, and a Latch 2813. The output of DRA is A when AS is active, and is tri-stated when AS is inactive. The output of DRB is B when BS is active, and is tri-stated when BS is inactive. The Latch is used to keep output Y at its current state after both AS and BS are inactivated.

FIG. 29 is a timing diagram depicting illustrative read and write timing aspects, consistent with one or more aspects of the innovations herein. FIG. 29 depicts the signal timing associated with FIGS. 19 through 28. An "(n)" listed in an Ain address field indicates that bank "n" is the target bank for that particular operation.

Note that when operating at maximum frequency (as illustrated in FIG. 13), the read operation, as evident from the width of MA(n) when it contains a read address, is greater than one cycle in duration, and the write operation, as evident from the width of MA(n) when it contains a write address, is less than one cycle in duration.

Note also that when operating at maximum frequency and a read operation is initiated in cycle "n", it must be to a different bank than the one read in cycle "n−1" because the two read operations will overlap some due to them being greater than one cycle in duration, and the one written in cycle "n−1" because the read operation will overlap with the entire write operation. These would be the only bank conflict restrictions in this particular implementation.

Note further that when operating at a slower frequency such that a read operation is less than one cycle in duration, a read operation initiated in cycle "n" can be to the same bank as the one read in cycle "n−1", and in that case the only remaining bank conflict restriction is that the read in cycle "n" cannot be to the same bank as the one written in cycle "n−1".

In addition to the above memory innovations and memory architecture, the present inventions also include, inter alia, methods of memory operation, methods of fabricating memory devices consistent with the features and/or functionality herein, products (such as SRAMs or products embodying SRAMs), and products produced via such processes. By way of example and not limitation, methods of memory fabrication herein may include known RAM manufacturing processes such as in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001, 674, 6,117,754, 6,127,706, 6,417,549, 6,894,356, and 7,910, 427 as well as U.S. patent application publication No. US2007/0287239A1, which are incorporated herein by reference.

In some instances, aspects of the innovations herein may be achieved involving logic and/or logic instructions including program modules, executed in association with the circuitry, for example. In general, program modules may include routines, programs, objects, components, data structures, etc. that performs particular tasks or implement particular logic, control, delay or instructions. The inventions may also be practiced in the context of distributed circuit settings where circuitry is connected via communication buses, circuitry or links. In distributed settings, control/instructions may occur from both local and remote computing elements including memory storage devices.

As disclosed herein, features consistent with the present inventions may be utilized via and/or involved with computer hardware, software and/or firmware. For example, the systems and methods disclosed herein may be embodied in or used in connection with various forms including, for example, memory, data processors, such as in computing devices that also includes memory, a database, digital electronic circuitry, firmware, software, or in combinations of them. Further, while some of the disclosed implementations describe specific hardware components, systems and methods consistent with the innovations herein may be implemented in the context of any combination of hardware, software and/or firmware. Moreover, the above-noted features and other aspects and principles of the innovations herein may be implemented in various memory environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic, control and/or functions disclosed herein may be enabled using any number of combinations of hardware, firmware, and/or as data/instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media), though does not include transitory media such as carrier waves.

Unless the context clearly requires otherwise, throughout the description and the elsewhere herein, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the inventions pertain that variations and modifications of the various implementations shown and described herein may be made without departing from the spirit and scope of the innovations herein. Accordingly, it is intended that the inventions be limited only to the extent required by the applicable rules of law.

The invention claimed is:

1. A multi-bank, dual-pipe SRAM device comprising:
   (i) a memory array comprising a plurality of SRAM banks, each SRAM bank including a block of single port SRAM memory cells organized as a matrix of rows and columns, a decoder, a sense amplifier, and a memory cell access circuitry, wherein each SRAM bank is capable of operating at a maximum frequency, f(m), and is configured for, and capable of, performing a read operation and a write operation together within a single f(m) clock cycle, the memory cell access circuitry comprising:
      a first read control input and a first write control input for initiating read and write operations in the same clock cycle for each and every clock cycle;
      a first input clock and a second input clock, wherein the second input clock is the inverse of the first input clock; and
      internal clock generation circuitry configured to:
         generate a first pipeline clock of frequency f(m), and a second pipeline clock of frequency f(m), having periods twice that of the first and second input clocks, wherein the first pipeline clock is high during the first pipeline clock cycles and the second pipeline clock is the inverse of the first pipeline clock; and
         generate a third pipeline clock of frequency f(m), and a fourth pipeline clock of frequency f(m), having periods twice that of the first and second input clocks, where the third pipeline clock is high during the second pipeline clock cycle and the fourth pipeline clock is the inverse of the third pipeline clock,
      wherein the access circuitry is configured to designate alternating clock cycles as a first pipeline clock cycle and a second pipeline clock cycle respectively;
   (ii) a read/write control input circuit that receives a read operation and a write operation within a first single external clock cycle of frequency, f(e), and provides those read and write operations to each SRAM bank in a time-multiplexed read/write stream at the frequency f(m);
   (iii) an address input circuit that receives a read address and a write address within a second single external clock cycle of frequency, f(e) and provides those read and write addresses to each SRAM bank in a time-multiplexed address stream at the frequency f(m);
   (iv) a data input circuit that receives first and second beats of write data within a third single external clock cycle of frequency, f(e), and provides the first and second beats of write data to each SRAM bank in a time-multiplexed write data stream at the frequency f(m); and
   (v) bank access circuitry at the plurality of SRAM banks, coupled to the read/write control input circuit, the address input circuit, and the data input circuit, that controls combinations of read and write operations to the SRAM banks at no greater than their maximum operating frequency, f(m);
   wherein the frequency, f(e), is at least twice the maximum frequency, f(m), that each SRAM bank is capable of operating at, and the read/write control input circuit operates at the frequency, f(e), and/or the address input circuit operates at the frequency, f(e), and/or the data input circuit operates at the frequency, f(e).

2. The device of claim 1, wherein at least two of the first single external clock cycle, the second single external clock cycle, and the third single external clock cycle are a same cycle of frequency f(m).

3. A Quad-B2 SRAM memory device comprising:
   a memory array comprising a plurality of SRAM banks, wherein each SRAM bank includes a block of single port SRAM memory cells organized as a matrix of rows and columns and memory cell access circuitry, the memory cell access circuitry comprising:
      a first read control input and a first write control input for initiating read and write operations in the same clock cycle for each and every clock cycle;
      a first input clock and a second input clock, wherein the second input clock is the inverse of the first input clock; and
      internal clock generation circuitry configured to:
         generate a first pipeline clock and a second pipeline clock having periods twice that of the first and second input clocks, wherein the first pipeline clock is high during the first pipeline clock cycles and the second pipeline clock is the inverse of the first pipeline clock; and
         generate a third pipeline clock and a fourth pipeline clock having periods twice that of the first and second input clocks, where the third pipeline clock is high during the second pipeline clock cycle and the fourth pipeline clock is the inverse of the third pipeline clock;
   wherein the access circuitry is configured to designate alternating clock cycles as a first pipeline clock cycle and a second pipeline clock cycle respectively.

4. The device of claim 3, wherein:
   a read operation initiated in the first pipeline clock cycle is paired with a write operation initiated in a same first pipeline clock cycle, wherein the read operation and the write operation are executed sequentially over two cycles, either to a same SRAM bank or to a different SRAM bank;
   the read operation is executed for less than a duration of two cycles, the write operation is executed for less than or equal to a duration of one cycle, and a combined duration of the read operation and the write operation of the first pipeline clock cycle does not exceed two cycles;

a read operation initiated in a second pipeline clock cycle is paired with a write operation initiated in a same second pipeline clock cycle, wherein the read operation and the write operation are executed sequentially over two cycles, either to a same SRAM bank or to a different SRAM bank; and the read operation is executed for less than a duration of two cycles, the write operation is executed for less than or equal to a duration of one cycle, and a combined duration of the read operation and the write operation of the second pipeline clock cycle does not exceed two cycles.

5. The device of claim 3, further comprising:

address circuitry configured to use the first input clock to latch a read address input per clock cycle and to use the second input clock to latch a write address input per clock cycle; and control circuitry configured to use the first input clock to latch a read control signal per clock cycle and to use the first input clock to latch a write control signal per clock cycle.

6. The device of claim 5, wherein:

the read addresses are restricted to a non-busy SRAM bank due to one or more busy SRAM banks based on previously-initiated read and write operations at the time the read address is input and a new read operation is subsequently generated; and the write addresses are not restricted insofar as any SRAM bank may be written to at any time regardless of the previously-initiated read and write operations.

7. The device of claim 5, further comprising an address input latch/mux configured to capture the read and write addresses, and time-multiplex the read and write addresses into a single address stream that is bussed to each SRAM bank.

8. The device of claim 7, wherein a first portion of the address input latch/mux comprises:

a first address register/latch configured to capture read addresses on the rising edge of the first input clock every cycle, regardless of the state of a first read control captured on the same rising edge of the first input clock; and a second address register/latch configured to capture write addresses on the rising edge of the second input clock, in cycles in which a first write control is captured low/active on the preceding rising edge of the first input clock.

9. The device of claim 8, wherein a second portion of the address input latch/mux comprises:

a first 2:1 address mux configured to time-multiplex the read and write addresses from the first address register/latch and the second address register/latch together into a single first address stream that is subsequently bussed to the each SRAM bank, wherein the first input clock high selects the read address from the first address register/latch to be multiplexed into the first address stream, and wherein the second input clock high selects the write address from the second address register/latch to be multiplexed into the first address stream.

10. The device of claim 9, wherein the first 2:1 address mux comprises:

a first mux input and a second mux input, a first mux input select dedicated to the first mux input and a second mux input select dedicated to the second mux input, and a mux output;

a first driver and a second driver each comprising:

an input, an enable, and an output such that the output is equal to the input when the enable is active, and is tri-stated when the enable is inactive;

wherein the first driver input is the first mux input, the second driver input is the second mux input, wherein the first driver enable is a first mux input select, the second driver enable is a second mux input select;

wherein the first and second driver outputs are dotted together to create the mux output; and a driver latch keeping the mux output at its current state when neither of the first mux input select and the second mux input select is active.

11. The device of claim 7, comprising a data input latch/mux configured to capture the first and second beats of write data and time-multiplexing them into a single SRAM bank data stream bussed to the each SRAM bank.

12. The device of claim 11, wherein a first portion of the data input latch/mux comprises:

a first data register/latch configured to capture the first beat of write data on the rising edge of the first data input clock every cycle, regardless of the state of a first write control captured on the rising edge of the first input clock in the same cycle; and a second data register/latch configured to capture the second beat of write data on the rising edge of the second data input clock every cycle, regardless of the state of the first write control captured on the rising edge of the first input clock in the same cycle.

13. The device of claim 12, wherein a second portion of the data input latch/mux comprises:

a third data register/latch configured to re-latch the first beat of write data from the first data register/latch on the rising edge of the second input clock, thereby transferring the data from the data input clock domain to the input clock domain and allowing for the data input clock edges to lead or trail the input clock edges by approximately a half cycle; and a fourth data register/latch configured to re-latch the second beat of write data from the second data register/latch on the rising edge of the first input clock, thereby transferring the data from the data input clock domain to the input clock domain and allowing for the data input clock edges to lead or trail the input clock edges by approximately a half cycle.

14. The device of claim 13, wherein a third portion of the data input latch/mux comprises:

a first 2:1 data mux configured to time-multiplex the first and second beats of write data from the third data register/latch and the fourth data register/latch together into a single SRAM bank data stream that is subsequently bussed to the each SRAM bank, wherein the second input clock high selects the first beat of write data from the third data register/latch to be multiplexed into the SRAM bank data stream;

wherein the first input clock high selects the second beat of write data from the fourth data register/latch to be multiplexed into the SRAM bank data stream.

15. The device of claim 14, wherein the SRAM bank circuitry at each SRAM bank de-multiplexes the two beats of write data in the SRAM bank data stream four ways into separate bank first pipeline first beat of write data, a bank first pipeline second beat of write data, a bank second pipeline first beat of write data, and a bank second pipeline second beat of write data, based on six data registers/latches divided into a first group of four data register/latches for the first beat of write data path, and a second group of two data registers/latches for the second beat of write data path;

wherein the first group comprises:
a fifth data register/latch configured to latch the first beat of write data in the SRAM bank data stream with the first pipeline write bank signal clock;
a sixth data register/latch configured to latch the first beat of write data in the SRAM bank data stream with the second pipeline write bank signal clock;
a seventh data register/latch configured to re-latch the first beat of write data from the fifth data register/latch with the third pipeline write bank signal clock, thereby generating the bank first pipeline first beat of write data valid for two cycles;
an eighth data register/latch configured to re-latch the first beat of write data from the sixth data register/latch with the fourth pipeline write bank signal clock, thereby generating the bank second pipeline first beat of write data valid for two cycles; and
wherein the second group comprises:
a ninth data register/latch configured to re-latch the second beat of write data in the SRAM bank data stream with the third pipeline write bank signal clock, thereby generating the bank first pipeline second beat of write data valid for two cycles concurrently with the associated bank first pipeline first beat of write data;
a tenth data register/latch configured to re-latch the second beat of write data in the SRAM bank data stream with the fourth pipeline write bank signal clock, thereby generating the bank second pipeline second beat of write data valid for two cycles concurrently with the associated bank second pipeline first beat of write data.

16. The device of claim 15, further comprising:
a first 2:1 bank data mux at each SRAM bank configured to time-multiplex the bank first pipeline first beat of write data from the seventh register/latch and the bank second pipeline first beat of write data from the eighth register/latch into a single first beat of write data stream sent to the corresponding SRAM bank, wherein:
a first one-shot pulse selects the bank first pipeline first beat of write data to be multiplexed into the first 2:1 mux first beat of write data stream; and
a second one-shot pulse selects the bank second pipeline first beat of write data to be multiplexed into the first 2:1 mux first beat of write data stream; and
a second 2:1 bank data mux at each SRAM bank configured to time-multiplex the bank first pipeline second beat of write data from the ninth register/latch and the bank second pipeline second beat of write data from tenth register/latch into a single second beat of write data stream sent to the corresponding SRAM bank, wherein:
a first one-shot pulse selects the bank first pipeline second beat of write data to be multiplexed into the second 2:1 mux second beat of write data stream; and
a second one-shot pulse selects the bank second pipeline second beat of write data to be multiplexed into the second 2:1 mux second beat of write data stream.

17. The device of claim 16, wherein:
each of the first 2:1 data mux, the first 2:1 bank data mux and the second 2:1 bank data mux comprises two mux inputs, two mux input selects with one dedicated per mux input, and a mux output;
the first driver and the second driver each comprising an input, an enable, and an output wherein the output is equal to the input when the enable is active, and is tri-stated when the enable is inactive;
the first driver input is the first mux input and the second driver input is the second mux input;
the first driver enable is the first input select and the second driver enable is the second input select;
the first driver output and the second driver output are dotted together to create the mux output; and
a driver latch keeping the mux output at its current state when neither of the mux input selects is activated.

18. The device of claim 5, further comprising control input latch (CIL) circuitry configured to capture the read control signal and the write control signal subsequently bussed to each SRAM bank.

19. The device of claim 18, wherein the control input latch (CIL) circuitry comprises:
a first CIL register/latch configured to capture the read control signal on the rising edge of the first input clock every clock cycle;
a second CIL register/latch configured to capture the write control signal on the rising edge of the first input clock every clock cycle; and
a third CIL register/latch configured to re-latch the output of the second CIL register/latch on the rising edge of second input clock every clock cycle.

20. The device of claim 19, wherein the CIL circuitry further comprises:
a first inverter configured to invert the output of the first CIL register/latch, thereby generating an active-high read control signal bussed to each SRAM bank; and
a second inverter configured to invert the output of the third CIL register/latch, thereby generating an active-high write control signal bussed to each SRAM bank.

21. The device of claim 3, further comprising:
a first data input clock and a second data input clock, mesochronous with or physically same as the first input clock and the second input clock, respectively, wherein the second data input clock is the inverse of the first data input clock; and
data circuitry configured to use the first data input clock to latch a first beat of write data transferred per clock cycle per write operation and to use the second data input clock to latch a second beat of write data transferred per clock cycle per write operation.

22. The device of claim 3, further comprising:
SRAM bank circuitry at each SRAM bank configured to decode and de-multiplex the bank addresses in the first address stream read and write address stream four ways into a first pipeline read bank signal, a first pipeline write bank signal, a second pipeline read bank signal, a second pipeline write bank signal, and from them generate a first pipeline read bank signal clock, a first pipeline write bank signal clock, a second pipeline read bank signal clock, a second pipeline write bank signal clock, respectively, wherein the bank addresses in the first address stream are decoded in an address pre-decoder to generate a single bit output bank signal which is active if the corresponding read or write operation is targeted for the corresponding SRAM bank;
wherein the bank signal is logically ANDed with the active-high read control signal to generate a read bank signal to ensure it is generated from a valid read address when it is subsequently latched by a first bank register/latch or a second bank register/latch;
wherein the bank signal is logically ANDed with the active-high write control signal to generate a write bank signal, to ensure it is generated from a valid write address when it is subsequently latched by a third bank register/latch or a fourth bank register/latch;

wherein a first bank register/latch and a second bank register/latch are used to de-multiplex the read bank signal two ways, which in turn are used to generate the first pipeline read bank signal clock and the second pipeline read bank signal clock, wherein the first bank register/latch latches the read bank signal with the first pipeline clock, thereby generating the first pipeline read bank signal which is then logically ANDed with the first pipeline clock to generate the first pipeline read bank signal clock;

wherein the second bank register/latch latches the read bank signal with the third pipeline clock, thereby generating the second pipeline read bank signal, which is then logically ANDed with the third pipeline clock to generate the second pipeline read bank signal clock;

wherein a third bank register/latch and a fourth bank register/latch are used to de-multiplex the write bank signal two ways, which in turn are used to generate the first pipeline write bank signal clock and the second pipeline write bank signal clock, wherein the third bank register/latch latches the write bank signal with the second pipeline clock, thereby generating the first pipeline write bank signal, which is then logically ANDed with the second pipeline clock to generate the first pipeline write bank signal clock; and wherein the fourth bank register/latch latches the write bank signal with the fourth pipeline clock, thereby generating the second pipeline write bank signal, which is then logically ANDed with the fourth pipeline clock to generate the second pipeline write bank signal clock.

23. The device of claim 22, further comprising:
a fifth bank register/latch configured to latch the first pipeline write bank signal clock with the third pipeline clock, thereby generating a third pipeline write bank signal clock; and
a sixth bank register/latch configured to latch the second pipeline write bank signal clock with the first pipeline clock, thereby generating a fourth pipeline write bank signal clock.

24. The device of claim 22, wherein:
the SRAM bank circuitry at each SRAM bank is configured to generate a self-timed first pipeline read bank pulse, a self-timed second pipeline read bank pulse, a self-timed first pipeline write bank pulse and a self-timed second pipeline write bank pulse;
the first pipeline read bank signal clock is used to generate the self-timed first pipeline read bank pulse that is active for less than a duration of two cycles, which causes a read operation to the bank;
the second pipeline read bank signal clock is used to generate a self-timed second pipeline read bank pulse that is active for less than a duration of two cycles, which causes a read operation to the bank;
the third pipeline write bank signal clock, the self-timed first pipeline read bank pulse, and the self-timed second pipeline write bank pulse are used to generate the self-timed first pipeline write bank pulse active for less than or equal to a duration of one cycle, which causes a write operation to the bank; and
the fourth pipeline write bank signal clock, the self-timed second pipeline read bank pulse, and the self-timed first pipeline write bank pulse, are used to generate the self-timed second pipeline write bank pulse active for less than or equal to a duration of one cycle, which causes a write operation to the bank.

25. The device of claim 24, wherein:
the combined duration of the self-timed first pipeline read bank pulse active and the self-timed first pipeline write bank pulse active is less than or equal to two cycles; and
the combined duration of the self-timed second pipeline read bank pulse active and the self-timed second pipeline write bank pulse active is less than or equal to two cycles.

26. The device of claim 3, further comprising:
SRAM bank circuitry at each SRAM bank configured decode and de-multiplex the non-bank addresses in the first address stream read and write address stream four ways into a non-bank first pipeline read address, a non-bank first pipeline write address, a non-bank second pipeline read address, a non-bank second pipeline write address, wherein the non-bank addresses in the first address stream are decoded in an address pre-decoder, wherein the SRAM bank circuitry comprises:
a first non-bank register/latch configured to latch the decoded non-bank addresses with the first pipeline read bank signal clock, thereby generating the non-bank first pipeline read address valid for two cycles;
a second non-bank register/latch configured to latch the decoded non-bank addresses with the first pipeline write bank signal clock, thereby generating the non-bank first pipeline write address valid for two cycles;
a third non-bank register/latch configured to latch the decoded non-bank addresses with the second pipeline read bank signal clock, thereby generating the non-bank second pipeline read address valid for two cycles; and
a fourth non-bank register/latch configured to latch the decoded non-bank addresses with the second pipeline write bank signal clock, thereby generating the non-bank second pipeline write address valid for two cycles.

27. The device of claim 26, further comprising:
a 4:1 address multiplexer at each SRAM bank configured to time-multiplex the non-bank first pipeline read address, the non-bank first pipeline write address, the non-bank second pipeline read address, and the non-bank second pipeline write address into a single SRAM bank address stream to read and write to the corresponding SRAM bank; wherein:
the self-timed first pipeline read bank pulse selects the non-bank first pipeline read address to be multiplexed into the SRAM bank address stream;
the self-timed first pipeline write bank pulse selects the non-bank first pipeline write address to be multiplexed into the SRAM bank address stream;
the self-timed second pipeline read bank pulse selects the non-bank second pipeline read address to be multiplexed into the SRAM bank address stream; and
the self-timed second pipeline write bank pulse selects the non-bank second pipeline write address to be multiplexed into the SRAM bank address stream.

28. The device of claim 27, wherein the 4:1 address multiplexer comprises:
first through fourth mux inputs, first through fourth mux input selects with one dedicated per mux input, and a mux output; and
first through fifth drivers; wherein each of the drivers includes an input, an enable, and an output such that the output is equal to the input when the enable is active, and is tri-stated when the enable is inactive;

wherein the first driver input is the first mux input, the second driver input is the second mux input, the third driver input is the third mux input, the fourth driver input is the mux input, and the fifth driver input is ground;

wherein the first driver enable is the first mux input select, the second driver enable is the second mux input select, the third driver enable is the third mux input select, the fourth driver enable is the fourth mux input select, and the fifth driver enabler is a logical NOR of the first, second, third, and fourth mux input selects;

wherein the first through fifth driver outputs are dotted together to create the mux output; and wherein the fifth driver causes the mux output to be "low" when none of the mux input select signals are active.

29. A Quad-B2 SRAM memory device comprising:

a memory array comprising a plurality of SRAM banks, wherein each SRAM bank includes a block of single port SRAM memory cells organized as a matrix of rows and columns and memory cell access circuitry, wherein the plurality of SRAM banks are active simultaneously;

wherein the memory cell access circuitry comprises:

a first read control input and a first write control input configured to initiate read and write operations in the same clock cycle for each and every clock cycle;

a first input clock and a second input clock, wherein the second input clock is the inverse of the first input clock; and internal clock generation circuitry configured to:

generate a first pipeline clock and a second pipeline clock having periods twice that of the first and second input clocks, wherein the first pipeline clock is high during the first pipeline clock cycles and the second pipeline clock is the inverse of the first pipeline clock; and generate a third pipeline clock and a fourth pipeline clock having periods twice that of the first and second input clocks, where the third pipeline clock is high during the second pipeline clock cycle and the fourth pipeline clock is the inverse of the third pipeline clock.

30. The device of claim 29, wherein:

a read operation initiated in any clock cycle is paired with a write operation initiated in a same clock cycle;

the read operation and the write operation are executed sequentially over two cycles, either to a same SRAM bank or to a different SRAM bank;

the read operation is executed for a duration of less than two cycles;

the write operation is executed for less than or equal to a duration of one cycle; and a combined duration of the read operation and the write operation does not exceed two cycles.

* * * * *